(12) United States Patent  
Shida et al.

(10) Patent No.: US 8,506,359 B2
(45) Date of Patent: Aug. 13, 2013

(54) AQUEOUS DISPERSION FOR CHEMICAL MECHANICAL POLISHING AND CHEMICAL MECHANICAL POLISHING METHOD

(75) Inventors: Hirotaka Shida, Yokkaichi (JP); Takafumi Shimizu, Yokkaichi (JP); Masatoshi Ikeda, Yokkaichi (JP); Shou Kubouchi, Yokkaichi (JP); Yousuke Shibata, Yokkaichi (JP); Kazuhito Uchikura, Yokkaichi (JP); Akihiro Takemura, Yokkaichi (JP)

(73) Assignee: JSR Corporation, Tokyo (JP)

( * ) Notice: Subject to any disclaimer, the term of this patent is extended or adjusted under 35 U.S.C. 154(b) by 424 days.

(21) Appl. No.: 12/866,571

(22) PCT Filed: Jan. 16, 2009

(86) PCT No.: PCT/JP2009/050545
§ 371 (c)(1),
(2), (4) Date: Nov. 5, 2010

(87) PCT Pub. No.: WO2009/098924
PCT Pub. Date: Aug. 13, 2009

(65) Prior Publication Data
US 2011/0053462 A1  Mar. 3, 2011

(30) Foreign Application Priority Data

| Feb. 6, 2008 | (JP) | 2008-025857 |
| Jun. 5, 2008 | (JP) | 2008-147776 |
| Jun. 16, 2008 | (JP) | 2008-156270 |
| Jun. 18, 2008 | (JP) | 2008-159431 |
| Jun. 19, 2008 | (JP) | 2008-160712 |
| Jul. 2, 2008 | (JP) | 2008-173444 |
| Jul. 8, 2008 | (JP) | 2008-177751 |

(51) Int. Cl.
*H01L 21/302* (2006.01)

(52) U.S. Cl.
USPC ........... 451/36; 451/28; 451/41; 451/60; 451/446; 216/88; 252/79.1; 438/692

(58) Field of Classification Search
USPC ........... 451/28, 36, 41, 60, 446; 216/88–89; 252/79.1–79.5; 438/692–693; 257/E21.23, 257/E21.304
See application file for complete search history.

(56) References Cited

U.S. PATENT DOCUMENTS 3,827,893 A * 8/1974 Meisser et al. ............ 106/603
6,541,367 B1  4/2003 Mandal
(Continued)

FOREIGN PATENT DOCUMENTS

| JP | 2001 298023 | 10/2001 |
| JP | 2001 308089 | 11/2001 |

(Continued)

OTHER PUBLICATIONS

International Search Report issued Feb. 24, 2009 in PCT/JP09/50545 filed Jan. 16, 2009.

*Primary Examiner* — George Nguyen
(74) *Attorney, Agent, or Firm* — Oblon, Spivak, McClelland, Maier & Neustadt, L.L.P.

(57) ABSTRACT

A chemical mechanical polishing aqueous dispersion including (A) silica particles, and (B1) an organic acid, the sodium content, the potassium content, and the ammonium ion content of the silica particles (A) determined by ICP atomic emission spectrometry, ICP mass spectrometry, or ammonium ion quantitative analysis using ion chromatography having a relationship in which the sodium content is 5 to 500 ppm and at least one of the potassium content and the ammonium ion content is 100 to 20,000 ppm.

29 Claims, 3 Drawing Sheets

(56) References Cited

U.S. PATENT DOCUMENTS

| | | | |
|---|---|---|---|
| 6,579,153 B2* | 6/2003 | Uchikura et al. | 451/41 |
| 6,596,627 B2 | 7/2003 | Mandal | |
| 6,656,021 B2* | 12/2003 | Ota et al. | 451/41 |
| 6,890,639 B2 | 5/2005 | Mandal | |
| 6,935,928 B2* | 8/2005 | Uchikura et al. | 451/36 |
| 7,005,382 B2* | 2/2006 | Nishimoto et al. | 438/690 |
| 7,012,030 B2 | 3/2006 | Mandal | |
| 7,094,710 B2 | 8/2006 | Mandal | |
| 7,205,224 B2 | 4/2007 | Mandal | |
| 7,399,697 B2 | 7/2008 | Mandal | |
| 7,560,384 B2 | 7/2009 | Shida et al. | |
| 7,601,631 B2 | 10/2009 | Mandal | |
| 7,633,163 B2 | 12/2009 | Mandal | |
| 2003/0068893 A1* | 4/2003 | Nishida et al. | 438/694 |
| 2006/0150860 A1 | 7/2006 | Nozaki | |
| 2006/0201914 A1 | 9/2006 | Uchikura et al. | |
| 2006/0276041 A1 | 12/2006 | Uchikura et al. | |
| 2007/0128874 A1 | 6/2007 | Shida et al. | |
| 2007/0181534 A1* | 8/2007 | Kamimura | 216/88 |
| 2007/0181850 A1* | 8/2007 | Kamimura et al. | 252/79.1 |
| 2008/0057716 A1 | 3/2008 | Yamashita | |
| 2008/0318427 A1 | 12/2008 | Kunitani et al. | |
| 2009/0124172 A1 | 5/2009 | Uchikura et al. | |
| 2009/0165395 A1 | 7/2009 | Ikeda et al. | |
| 2009/0181540 A1 | 7/2009 | Shida et al. | |
| 2009/0221213 A1 | 9/2009 | Namie et al. | |
| 2009/0239373 A1 | 9/2009 | Shida et al. | |
| 2009/0291620 A1 | 11/2009 | Kunitani et al. | |
| 2009/0302266 A1 | 12/2009 | Takemura et al. | |
| 2009/0325383 A1 | 12/2009 | Andou et al. | |
| 2010/0075501 A1 | 3/2010 | Abe et al. | |
| 2010/0081291 A1 | 4/2010 | Mandal | |
| 2010/0099260 A1 | 4/2010 | Matsumoto et al. | |
| 2010/0221918 A1 | 9/2010 | Takemura et al. | |
| 2011/0081780 A1* | 4/2011 | Shida et al. | 438/693 |
| 2011/0250756 A1 | 10/2011 | Uchikura et al. | |

FOREIGN PATENT DOCUMENTS

| | | |
|---|---|---|
| JP | 2003 109921 | 4/2003 |
| JP | 2003 197573 | 7/2003 |
| JP | 2006 8046 | 3/2006 |
| JP | 2007 266597 | 10/2007 |
| WO | 2004 74180 | 9/2004 |
| WO | 2007 018069 | 2/2007 |
| WO | 2007 69488 | 6/2007 |
| WO | 2007 072918 | 6/2007 |
| WO | 2007 116770 | 10/2007 |

* cited by examiner

US 8,506,359 B2

AQUEOUS DISPERSION FOR CHEMICAL MECHANICAL POLISHING AND CHEMICAL MECHANICAL POLISHING METHOD

CROSS-REFERENCE TO RELATED APPLICATIONS

The present application is a 35 U.S.C. §371 national stage patent application of International patent application PCT/JP09/050,545, filed on Jan. 16, 2009, the text of which is incorporated by reference, and claims the benefit of the filing date of Japanese application nos. JP2008-025857, filed on Feb. 6, 2008, JP2008-147776, filed on Jun. 5, 2008, JP2008-156270, filed on Jun. 16, 2008, JP2008-159431, filed on Jun. 18, 2008, JP2008-160712, filed on Jun. 19, 2008, JP2008-173444, filed on Jul. 2, 2008, and JP2008-177751, filed on Jul. 8, 2008, the text of each also being incorporated by reference.

TECHNICAL FIELD

The present invention relates to a chemical mechanical polishing aqueous dispersion and a chemical mechanical polishing method.

BACKGROUND ART

In recent years, use of a low-dielectric-constant interlayer dielectric (hereinafter may be referred to as "low-dielectric-constant insulating film") has been studied in order to prevent a signal delay due to multilayer interconnection of semiconductor devices. A material disclosed in JP-A-2001-308089 or JP-A-2001-298023 has been proposed as a material for the low-dielectric-constant insulating film, for example. When using the low-dielectric-constant insulating film as an interlayer dielectric, copper or a copper alloy is used as an interconnect material since high conductivity is required. When producing such a semiconductor device using a damascene process, a step of removing the interconnect material on the barrier metal film by chemical mechanical polishing (first polishing step), and a step of removing the barrier metal film by chemical mechanical polishing, and optionally chemically and mechanically polishing the interconnect material and the interlayer dielectric to implement planarization (second polishing step), are normally required.

In the first polishing step, only the interconnect material must be selectively polished at high speed. However, it is very difficult to implement a state in which dishing and erosion do not occur in the interconnect area when the first polishing step has completed (i.e., when the barrier metal film and the like have been exposed) while maintaining a high polishing rate of the interconnect material. For example, the polishing rate may be increased by increasing the polishing pressure so that a higher frictional force is applied to the wafer. However, since dishing and erosion of the interconnect area occur to a larger extent by increasing the polishing rate, an effect achieved by the polishing method is limited. In order to obtain an excellent polished surface by the second polishing step, it is necessary to suppress a copper residue on the fine interconnect pattern in the first polishing step.

It is difficult to eliminate a copper residue due to the first polishing step or remove a copper residue due to the first polishing step by a simple washing step by the current polishing methods while implementing high-speed polishing and high flatness. Therefore, development of a novel chemical mechanical polishing aqueous dispersion that solves the above problems has been desired.

The second polishing step is required to flatly polish the polishing target surface. A change in design of the structure of semiconductor devices has been studied in order to further improve the flatness of the polishing target surface achieved by the second polishing step. Specifically, when using a low-dielectric-constant insulating film that has low mechanical strength, a structure in which a cap layer made of silicon dioxide or the like is formed on the low-dielectric-constant insulating film, etc., has been studied since (1) surface defects (e.g., separation and scratches) may occur on the polishing target surface due to chemical mechanical polishing, (2) the polishing rate of the low-dielectric-constant insulating film significantly increases when polishing a wafer that has a fine interconnect structure so that a flat polished surface with high accuracy may not be obtained, and (3) the adhesion between the barrier metal film and the low-dielectric-constant insulating film is low, for example. In this case, the second polishing step is required to quickly remove the cap layer by polishing while reducing the polishing rate of the low-dielectric-constant insulating film as much as possible. Specifically, the polishing rate (RR1) of the cap layer and the polishing rate (RR2) of the low-dielectric-constant insulating film must satisfy the relationship "RR1>RR2".

In order to prevent breakage of the low-dielectric-constant insulating film and interfacial separation between the low-dielectric-constant insulating film and the stacked material, the polishing pressure may be reduced to reduce the frictional force applied to the wafer. In this case, since the polishing rate decreases by reducing the polishing pressure, the production efficiency of semiconductor devices significantly decreases. In order to solve the above problems, WO 2007/116770 discloses increasing the polishing rate by adding a water-soluble polymer to the chemical mechanical polishing aqueous dispersion. However, the polishing rate achieved by this method in the second polishing step is not necessarily sufficient.

Therefore, development of a novel chemical mechanical polishing aqueous dispersion that can polish the barrier metal film and the cap layer at a high polishing rate and achieves high flatness while preventing damage to the low-dielectric-constant insulating film has been desired.

A chemical mechanical polishing aqueous dispersion normally includes abrasive grains and additive components. In recent years, the chemical mechanical polishing aqueous dispersion has been mainly developed while focusing on the combination of the additive components. On the other hand, JP-A-2003-197573 or JP-A-2003-109921 discloses improving the polishing performance by controlling the properties of the abrasive grains.

However, when using the abrasive grains disclosed in JP-A-2003-197573 or JP-A-2003-109921, since the abrasive grains contain a metal component (e.g., sodium), it is difficult to remove the metal component (e.g., sodium) that remains on the polishing target after polishing. This makes it difficult to apply the abrasive grains disclosed in JP-A-2003-197573 or JP-A-2003-109921 to polishing of actual devices. Moreover, the abrasive grains disclosed in JP-A-2003-197573 or JP-A-2003-109921 exhibit poor storage stability due to poor dispersion stability.

DISCLOSURE OF THE INVENTION

An object of the invention is to provide a chemical mechanical polishing aqueous dispersion that does not cause defects of a metal film or a low-dielectric-constant insulating film, reduces the polishing rate of a low-dielectric-constant insulating film, can polish an interlayer dielectric (cap layer) such as a TEOS film at a high polishing rate, achieves high flatness, and reduces contamination of a wafer due to a metal, and a chemical mechanical polishing method using the chemical mechanical polishing aqueous dispersion.

Another object of the invention is to provide a chemical mechanical polishing aqueous dispersion that can polish a copper film at a high polishing rate with high polishing selectivity under normal pressure conditions without causing defects of a metal film and a low-dielectric-constant insulating film, and reduces contamination of a wafer due to a metal, and a chemical mechanical polishing method using the chemical mechanical polishing aqueous dispersion.

According to the invention, there is provided a first chemical mechanical polishing aqueous dispersion comprising (A) silica particles, and (B1) an organic acid, the sodium content, the potassium content, and the ammonium ion content of the silica particles (A) determined by ICP atomic emission spectrometry, ICP mass spectrometry, or ammonium ion quantitative analysis using ion chromatography having a relationship in which the sodium content is 5 to 500 ppm and at least one of the potassium content and the ammonium ion content is 100 to 20,000 ppm.

The first chemical mechanical polishing aqueous dispersion according to the invention may include the following features.

The organic acid (B1) may be an organic acid that includes two or more carboxyl groups.

The organic acid that includes two or more carboxyl groups may have an acid dissociation constant (pKa) at 25° C. of 5.0 or more, the acid dissociation constant (pKa) being an acid dissociation constant (pKa) of a second carboxyl group when the organic acid includes two carboxyl groups, and an acid dissociation constant (pKa) of a third carboxyl group when the organic acid includes three or more carboxyl groups.

The organic acid that includes two or more carboxyl groups may be at least one organic acid selected from maleic acid, malonic acid, and citric acid.

The first chemical mechanical polishing aqueous dispersion may further comprise (C1) a nonionic surfactant.

The nonionic surfactant (C1) may include at least one acetylene group.

The nonionic surfactant (C1) may be a compound shown by the following general formula (1),

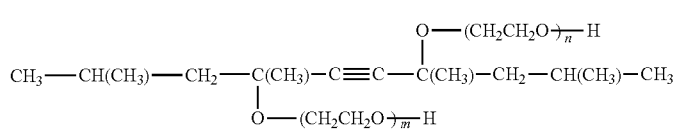

wherein m and n are individually integers equal to or larger than one, provided that m+n≦50 is satisfied.

The first chemical mechanical polishing aqueous dispersion may further comprise (D1) a water-soluble polymer having a weight average molecular weight of 50,000 to 5,000,000.

The water-soluble polymer (D1) may be a polycarboxylic acid.

The polycarboxylic acid may be poly(meth)acrylic acid.

The content of the water-soluble polymer (D1) may be 0.001 to 1.0 mass % based on the total mass of the first chemical mechanical polishing aqueous dispersion.

The silica particles (A) may have a ratio (Rmax/Rmin) of a major axis (Rmax) to a minor axis (Rmin) of 1.0 to 1.5.

The silica particles (A) may have an average particle diameter calculated from a specific surface area determined by a BET method of 10 to 100 nm.

The first chemical mechanical polishing aqueous dispersion may have a pH of 6 to 12.

According to the invention, there is provided a second chemical mechanical polishing aqueous dispersion that is used to polish a copper film, the second chemical mechanical polishing aqueous dispersion comprising (A) silica particles, and (B2) an amino acid, the sodium content, the potassium content, and the ammonium ion content of the silica particles (A) determined by ICP atomic emission spectrometry, ICP mass spectrometry, or ammonium ion quantitative analysis using ion chromatography having a relationship in which the sodium content is 5 to 500 ppm and at least one of the potassium content and the ammonium ion content is 100 to 20,000 ppm.

The second chemical mechanical polishing aqueous dispersion according to the invention may include the following features.

The amino acid (B2) may be at least one amino acid selected from glycine, alanine, and histidine.

The second chemical mechanical polishing aqueous dispersion may further comprise an organic acid that includes a nitrogen-containing heterocyclic ring and a carboxyl group.

The second chemical mechanical polishing aqueous dispersion may further comprise (C2) an anionic surfactant.

The anionic surfactant (C2) may include at least one functional group selected from a carboxyl group, a sulfonic acid group, a phosphoric acid group, and ammonium salts and metal salts of these functional groups.

The anionic surfactant (C2) may be selected from alkyl sulfates, alkyl ether sulfate salts, alkyl ether carboxylates, alkylbenzenesulfonates, alpha-sulfofatty acid ester salts, alkyl polyoxyethylene sulfates, alkyl phosphates, monoalkyl phosphate salts, naphthalenesulfonates, alpha-olefin sulfonates, alkanesulfonates, and alkenylsuccinates.

The anionic surfactant (C2) may be a compound shown by the following general formula (2),

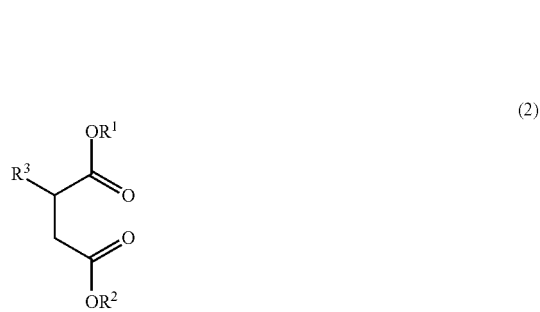

wherein $R^1$ and $R^2$ individually represent a hydrogen atom, a metal atom, or a substituted or unsubstituted alkyl group, and $R^3$ represents a substituted or unsubstituted alkenyl group or a sulfonic acid group ($-SO_3X$) (wherein X represents a hydrogen ion, an ammonium ion, or a metal ion).

The second chemical mechanical polishing aqueous dispersion may further comprise (D2) a water-soluble polymer that has a weight average molecular weight of 10,000 to 1,500,000, and has properties of a Lewis base.

The water-soluble polymer (D2) may have at least one molecular structure selected from a nitrogen-containing heterocyclic ring and a cationic functional group.

The water-soluble polymer (D2) may be a homopolymer that includes a nitrogen-containing monomer as a repeating unit, or a copolymer that includes a nitrogen-containing monomer as a repeating unit.

The nitrogen-containing monomer may be at least one compound selected from N-vinylpyrrolidone, (meth)acrylamide, N-methylolacrylamide, N-2-hydroxyethylacrylamide, acryloylmorpholine, N,N-dimethylaminopropylacrylamide, a diethyl sulfate salt thereof, N,N-dimethylacrylamide, N-isopropylacrylamide, N-vinylacetamide, N,N-dimethylaminoethylmethacrylic acid, a diethyl sulfate salt thereof, and N-vinylformamide.

The silica particles (A) may have a ratio (Rmax/Rmin) of a major axis (Rmax) to a minor axis (Rmin) of 1.0 to 1.5.

The silica particles (A) may have an average particle diameter calculated from a specific surface area determined by a BET method of 10 to 100 nm.

The second chemical mechanical polishing aqueous dispersion may have a pH of 6 to 12.

According to the invention, there is provided a first chemical mechanical polishing method comprising polishing a polishing target surface of a semiconductor device that includes at least one of a metal film, a barrier metal film, and an insulating film using the first chemical mechanical polishing aqueous dispersion The first chemical mechanical polishing aqueous dispersion can reduce the polishing rate of a low-dielectric-constant insulating film, and can polish an interlayer dielectric (cap layer) such as a TEOS film at a high polishing rate while achieving high flatness. The first chemical mechanical polishing aqueous dispersion can also implement high-quality chemical mechanical polishing without causing defects of a metal film and a low-dielectric-constant insulating film, and can reduce contamination of a wafer due to a metal.

The second chemical mechanical polishing aqueous dispersion can polish a copper film at a high polishing rate while achieving high polishing selectivity. Moreover, the chemical mechanical polishing aqueous dispersion can implement high-quality chemical mechanical polishing under normal pressure conditions without causing defects of a metal film and a low-dielectric-constant insulating film, and can reduce contamination of a wafer due to a metal.

BEST MODE FOR CARRYING OUT THE INVENTION

Figure 1:
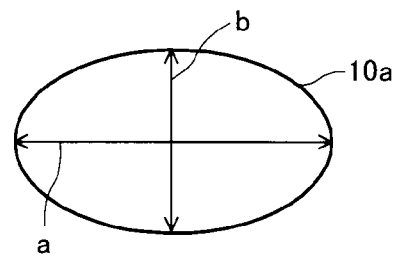
FIG. 1 is a diagram schematically illustrating the major axis and the minor axis of a silica particle.

Preferred embodiments of the invention are described in detail below.

1. First Chemical Mechanical Polishing Aqueous Dispersion

A first chemical mechanical polishing aqueous dispersion according to one embodiment of the invention includes (A) silica particles, and (B1) an organic acid, the sodium content, the potassium content, and the ammonium ion content of the silica particles (A) determined by ICP atomic emission spectrometry, ICP mass spectrometry, or ammonium ion quantitative analysis using ion chromatography have a relationship in which the sodium content is 5 to 500 ppm and at least one of the potassium content and the ammonium ion content is 100 to 20,000 ppm. Each component of the chemical mechanical polishing aqueous dispersion according to this embodiment is described below.

1.1 Silica Particles (A)

The silica particles (A) used in this embodiment have a sodium content of 5 to 500 ppm, preferably 10 to 400 ppm, and particularly preferably 15 to 300 ppm. At least one of the potassium content and the ammonium ion content of the silica particles (A) is 100 to 20,000 ppm. When the silica particles (A) include potassium, the potassium content is preferably 100 to 20,000 ppm, more preferably 500 to 15,000 ppm, and particularly preferably 1000 to 10,000. When the silica particles (A) include ammonium ions, the ammonium ion content is preferably 100 to 20000 ppm, more preferably 200 to 10,000 ppm, and particularly preferably 500 to 8000. When the potassium content or the ammonium ion content in the silica particles (A) is outside the above range, the effects of the invention can be obtained when the total content of potassium and ammonium ions is 100 to 20,000 ppm, preferably 500 to 15,000 ppm, and more preferably 1000 to 10,000.

If the sodium content is higher than 500 ppm, a wafer may be contaminated due to polishing. A sodium content of lower than 5 ppm cannot be achieved without performing an ion-exchange process a plurality of times. This is technically difficult.

If at least one of the potassium content and the ammonium ion content is higher than 20,000 ppm, the pH of the silica particle dispersion may increase to a large extent, so that the silica may be dissolved. If at least one of the potassium content and the ammonium ion content is lower than 100 ppm, the silica particles may exhibit inferior dispersion stability (i.e., the silica particle may aggregate), so that defects may occur on a wafer.

Note that the sodium content and the potassium content of the silica particles refer to values determined by ICP atomic emission spectrometry (ICP-AES) or ICP mass spectrometry (ICP-MS). An ICP atomic emission spectrometer "ICPE-9000" (manufactured by Shimadzu Corporation) or the like may be used for ICP optical emission spectroscopy. An ICP mass spectrometer "ICPE-8500" (manufactured by Shimadzu Corporation), "ELAN DRC PLUS" (manufactured by Perkin-Elmer), or the like may be used for ICP mass spectroscopy. The sodium content and the ammonium ion content of the silica particles refer to a value determined by ion chromatography. A non-suppressor ion chromatograph "HIS- NS2 (manufactured by Shimadzu Corporation), "ICS-1000" (manufactured by DIONEX) or the like may be used for ion chromatography. Sodium and potassium included in the silica particles may be a sodium ion and a potassium ion, respectively. The sodium content, the potassium content, and the ammonium ion content of the silica particles can be determined by measuring the sodium ion content, the potassium ion content, and the ammonium ion content. Note that the sodium content, the potassium content, and the ammonium ion content used herein refer to the weight of sodium, potassium, and ammonium ions based on the weight of the silica particles.

If the silica particles include sodium and at least one of potassium and ammonium ions within the above range, the silica particles are stably dispersed in the chemical mechanical polishing aqueous dispersion. Therefore, aggregation of the silica particles that may cause defects during polishing does not occur. Moreover, contamination of a wafer due to a metal during polishing can be prevented.

The average particle diameter of the silica particles calculated from the specific surface area determined by the BET method is preferably 10 to 100 nm, more preferably 10 to 90 nm, and particularly preferably 10 to 80 nm. If the average particle diameter of the silica particles is within the above range, the chemical mechanical polishing aqueous dispersion exhibits excellent storage stability. Moreover, a flat polished surface without defects can be obtained. If the average particle diameter of the silica particles is less than 10 nm, the polishing rate of an interlayer dielectric (cap layer) such as a TEOS film decreases to a large extent. If the average particle diameter of the silica particles is more than 100 nm, the silica particles may exhibit inferior storage stability.

The average particle diameter of the silica particles is calculated from the specific surface area determined by the BET method using a measuring instrument "Micrometrics Flow-Sorb II 2300" (manufactured by Shimadzu Corporation), for example.

The average particle diameter of the silica particles is calculated from the specific surface area as follows.

The diameter of the silica particle is referred to as d (nm), and the specific gravity of the colloidal silica particle is referred to as $\rho$ (g/cm$^3$) on the assumption that the shape of the silica particle is spherical. The surface area A of n particles is $n\pi td^2$. The mass N of n particles is $\rho n\pi d^3/6$. The specific surface area S is indicated by the surface area of all particles contained in a powder per unit mass. Therefore, the specific surface area S of n particles is $A/N=6/\rho d$. Substituting the specific gravity $\rho$ (=2.2) of the silica particles in this expression and converting the unit yields the following expression (3).

$$\text{Average particle diameter (nm)} = 2727/S\ (m^2/g) \quad (3)$$

The average particle diameter of the silica particles mentioned herein is calculated by the expression (3).

The ratio (Rmax/Rmin) of the major axis (Rmax) to the minor axis (Rmin) of the silica particles is 1.0 to 1.5, preferably 1.0 to 1.4, and more preferably 1.0 to 1.3. If the ratio (Rmax/Rmin) is within the above range, a high polishing rate and excellent flatness can be achieved without causing defects of a metal film and an insulating film. If the ratio (Rmax/Rmin) is larger than 1.5, defects may occur due to polishing.

The major axis (Rmax) of the silica particle refers to the longest distance between peripheral points of an image of the silica particle photographed using a transmission electron microscope. The minor axis (Rmin) of the silica particle refers to the shortest distance between peripheral points of an image of the silica particle photographed using a transmission electron microscope.

Figure 2:
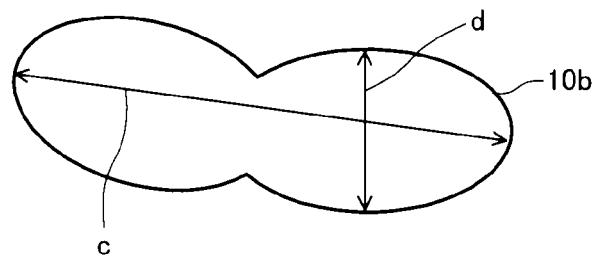
FIG. 2 is a diagram schematically illustrating the major axis and the minor axis of a silica particle.
Figure 3:
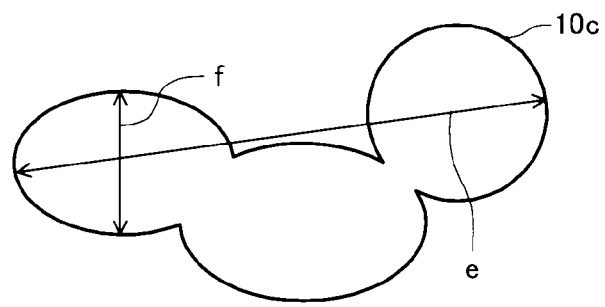
FIG. 3 is a diagram schematically illustrating the major axis and the minor axis of a silica particle.

As shown in FIG. 1, when an image of a silica particle 10a photographed using a transmission electron microscope is elliptical, the major axis a of the elliptical shape is determined to be the major axis (Rmax) of the silica particle, and the minor axis b of the elliptical shape is determined to be the minor axis (Rmin) of the silica particle. As shown in FIG. 2, when an image of a silica particle 10b photographed using a transmission electron microscope is an aggregate of two particles, the longest distance c between peripheral points of the image is determined to be the major axis (Rmax) of the silica particle, and the shortest distance d between peripheral points of the image is determined to be the minor axis (Rmin) of the silica particle. As shown in FIG. 3, when an image of a silica particle 10c photographed using a transmission electron microscope is an aggregate of three particles, the longest distance e between peripheral points of the image is determined to be the major axis (Rmax) of the silica particle, and the shortest distance f between peripheral points of the image is determined to be the minor axis (Rmin) of the silica particle.

For example, the major axis (Rmax) and the minor axis (Rmin) of each of fifty silica particles are measured using the above method. The average major axis (Rmax) and the average minor axis (Rmin) are calculated, and the ratio (Rmax/Rmin) of the major axis to the minor axis is then calculated.

The silica particles (A) are preferably used in an amount of 1 to 20 mass %, more preferably 1 to 15 mass %, and particularly preferably 1 to 10 mass %, based on the total mass of the chemical mechanical polishing aqueous dispersion during use. If the amount of the silica particles is less than 1 mass %, a sufficient polishing rate may not be obtained. If the amount of the silica particles is more than 20 mass %, cost may increase. Moreover, a stable chemical mechanical polishing aqueous dispersion may not be obtained.

The silica particles (A) used in this embodiment may be produced by an arbitrary method insofar as the content of sodium, potassium, and ammonium ions is within the above range. For example, the silica particles (A) may be produced by a silica particle dispersion production process disclosed in JP-A-2003-109921 or JP-A-2006-80406.

The silica particles may also be produced by removing alkali from a alkali silicate aqueous solution. Examples of the alkali silicate aqueous solution include a sodium silicate aqueous solution (water glass), an ammonium silicate aqueous solution, a lithium silicate aqueous solution, a potassium silicate aqueous solution, and the like. Examples of the ammonium silicate include silicates of ammonium hydroxide and tetramethylammonium hydroxide.

A specific method of producing the silica particles (A) used in this embodiment is described below. A sodium silicate aqueous solution that include 20 to 38 mass % of silica and has an SiO$_2$/Na$_2$O molar ratio of 2.0 to 3.8 is diluted with water to obtain a diluted sodium silicate aqueous solution having a silica concentration of 2 to 5 mass %. The diluted sodium silicate aqueous solution is passed through a hydrogen cation-exchange resin layer to obtain an active silica aqueous solution from which most of the sodium ions have been removed. The silicic acid aqueous solution is thermally aged with stirring while adjusting the pH to 7 to 9 using alkali to produce colloidal silica particles having a desired particle size. A small amount of the active silica aqueous solution or small colloidal silica particles are gradually added during thermal aging to obtain silica particles having an average particle diameter of 10 to 100 nm, for example. The silica particle dispersion thus obtained is concentrated to a silica concentration of 20 to 30 mass %, and passed through the hydrogen cation-exchange resin layer to remove most of the sodium ions. The pH of the silica particle dispersion is then adjusted using alkali to obtain silica particles that include 5 to 500 ppm of sodium and 100 to 20,000 ppm of at least one of potassium and ammonium ions.

The sodium content, the potassium content, and the ammonium ion content of the silica particles (A) may be determined by collecting silica particles from a silica particle-containing chemical mechanical polishing aqueous dispersion by centrifugation, ultrafiltration, or the like, and quantitatively determining sodium, potassium, and ammonium ion included in the collected silica particles. Therefore, whether or not the requirement of the invention is satisfied can be determined by analyzing the silica component thus collected from the chemical mechanical polishing aqueous dispersion using a known method.

1.2. Organic Acid (B1)

The chemical mechanical polishing aqueous dispersion according to this embodiment includes the organic acid (B1). The organic acid (B1) is preferably an organic acid that includes two or more carboxyl groups. An organic acid that includes two or more carboxyl groups has the following effects.

(1) The organic acid is coordinated with a metal ion (e.g., copper, tantalum, or titanium) dissolved into the chemical mechanical polishing aqueous dispersion due to polishing, thus preventing metal precipitation. As a result, polishing defects (e.g., scratches) can be suppressed.

(2) The organic acid increases the polishing rate of the polishing target (e.g., copper film, barrier metal film, or TEOS film). When adding a water-soluble polymer described later to the chemical mechanical polishing aqueous dispersion, the water-soluble polymer may protect the polishing target surface so that the polishing rate may decrease. In this case, the polishing rate of the polishing target can be improved by utilizing the organic acid that includes two or more carboxyl groups in combination with the water-soluble polymer.

(3) The organic acid is coordinated with a sodium ion or a potassium ion that is eluted from the silica particles during polishing, so that adhesion of the sodium ion or the potassium ion to the polishing target side can be prevented. As a result, the sodium ion or the potassium ion is mixed into the solution, and can be easily removed.

(4) The organic acid is considered to adhere to the surface of the silica particles, and improve the dispersion stability of the silica particles. This improves the storage stability of the silica particles, and significantly reduces the number of scratches that are considered to be caused by aggregated particles.

On the other hand, since an organic acid that includes one carboxyl group (e.g., formic acid, acetic acid, or propionic acid) is not likely to be coordinated with a metal ion, the polishing rate of the polishing target may not be improved.

The organic acid that includes two or more carboxyl groups preferably has an acid dissociation constant (pKa) at 25° C. of 5.0 or more in at least one dissociation stage. Note that the acid dissociation constant (pKa) refers to the acid dissociation constant (pKa) of a second carboxyl group when the organic acid includes two carboxyl groups, and the acid dissociation constant (pKa) of a third carboxyl group when the organic acid includes three or more carboxyl groups. If the organic acid has an acid dissociation constant (pKa) of 5.0 or more, the organic acid is more likely to be coordinated with a metal ion (e.g., copper, tantalum, or titanium) dissolved into the chemical mechanical polishing aqueous dispersion due to polishing, thus preventing metal precipitation. This prevents scratches that may occur on the polishing target surface. Moreover, since a change in pH of the polishing composition during polishing can be suppressed, a situation in which the silica particles (A) aggregate during polishing due to a change in pH can be suppressed. If the acid dissociation constant (pKa) is less than 5.0, the above effects may not be achieved.

The acid dissociation constant (pKa) may be measured by (a) a method described in The Journal of Physical Chemistry, vol. 68, No. 6, p. 1560 (1964), or (b) using a potential difference automatic titration apparatus (e.g., COM-980 Win) manufactured by Hiranuma Sangyo Co., Ltd., for example. Alternatively, (c) the acid dissociation constant described in Kagaku. Binran (edited by The Chemical Society of Japan) (third edition, Jun. 25, 1984, Maruzen Co., Ltd.), (d) pKa-BASE of Compudrug, or the like may also be used.

Examples of the organic acid that includes two or more carboxyl groups and has an acid dissociation constant (pKa) of 5.0 or more include organic acids shown in Table 1. In Table 1, the acid dissociation constant (pKa) indicates the acid dissociation constant (pKa) of a second carboxyl group when the organic acid includes two carboxyl groups, and indicates the acid dissociation constant (pKa) of a third carboxyl group when the organic acid includes three or more carboxyl groups.

TABLE 1

| Organic acid that includes two or more carboxyl groups | pKa |
| --- | --- |
| Maleic acid | 5.83 |
| Malonic acid | 5.28 |
| Phthalic acid | 5.41 |
| Succinic acid | 5.64 |
| Phenylsuccinic acid | 5.55 |
| Citric acid | 6.40 |
| 2-Methylmalonic acid | 5.76 |
| 2-Ethylmalonic acid | 5.81 |
| 2-Isopropylmalonic acid | 5.88 |
| 2,2-Dimethylmalonic acid | 5.73 |
| 2-Ethyl-2-methylmalonic acid | 6.55 |
| 2,2-Diethylmalonic acid | 7.42 |
| 2,2-Diisopropylmalonic acid | 8.85 |
| m-Hydroxybenzoic acid | 9.96 |
| p-Hydroxybenzoic acid | 9.46 |
| 1,2-Cyclohexanedicarboxylic acid (trans) | 6.06 |
| 1,2-Cyclohexanedicarboxylic acid (cis) | 6.74 |
| 1,2-Cyclopentanedicarboxylic acid (trans) | 5.99 |
| 1,2-Cyclopentanedicarboxylic acid (cis) | 6.57 |
| 1,2-Cyclooctanedicarboxylic acid (trans) | 6.24 |
| 1,2-Cyclooctanedicarboxylic acid (cis) | 7.34 |
| 1,2-Cycloheptanedicarboxylic acid (trans) | 6.18 |
| 1,2-Cycloheptanedicarboxylic acid (cis) | 7.60 |
| 2,3-Dimethylsuccinic acid | 6.00 |
| 2,3-Diethylsuccinic acid | 6.46 |
| 2-Ethyl-3-methylsuccinic acid | 6.10 |
| Tetramethylsuccinic acid | 7.41 |
| 2,3-Di-t-butylsuccinic acid | 10.26 |
| 3,3-Dimethylglutaric acid | 6.45 |
| 3,3-Diethylglutaric acid | 7.42 |
| 3-Isopropyl-3-methylglutaric acid | 6.92 |
| 3-t-Butyl-3-methylglutaric acid | 7.49 |
| 3,3-Diisopropylglutaric acid | 7.68 |
| 3-Methyl-3-ethylglutaric acid | 6.70 |
| 3,3-Dipropylglutaric acid | 7.48 |
| 2-Ethyl-2-(1-ethylpropyl)glutaric acid | 7.31 |
| Cyclohexyl-1,1-diacetic acid | 7.08 |
| 2-Methylcyclohexyl-1,1-diacetic acid | 6.89 |
| Cyclopentyl-1,1-diacetic acid | 6.77 |
| 3-Methyl-3-phenylglutaric acid | 6.17 |
| 3-Ethyl-3-phenylglutaric acid | 6.95 |

Among the organic acids shown in Table 1, maleic acid, malonic acid, and citric acid are preferable, with maleic acid being particularly preferable. Since the above organic acid has a preferable acid dissociation constant (pKa), and has a small steric hindrance, the above organic acid is likely to be coordinated with a metal ion (e.g., copper, tantalum, or titanium) dissolved into the chemical mechanical polishing aqueous dispersion due to polishing, thus preventing metal precipitation.

The content of the organic acid that includes two or more carboxyl groups is preferably 0.001 to 3.0 mass %, and more preferably 0.01 to 2.0 mass %, based on the total mass of the chemical mechanical polishing aqueous dispersion. If the content of the organic acid is less than 0.001 mass %, surface defects may occur (e.g., a large number of scratches may occur on the copper film). If the content of the organic acid is more than 3.0 mass %, the silica particles may aggregate (i.e., storage stability may be impaired).

Note that the above effects are achieved when the chemical mechanical polishing aqueous dispersion includes at least one organic acid that includes two or more carboxyl groups. Specifically, the chemical mechanical polishing aqueous dispersion may also include an organic acid other than the organic acid that includes two or more carboxyl groups.

1.3 Nonionic Surfactant (C1)

The chemical mechanical polishing aqueous dispersion according to this embodiment may include (C1) a nonionic surfactant. The polishing rate of an interlayer dielectric can be controlled by adding the nonionic surfactant. Specifically, the polishing rate of a cap layer (e.g., TEOS film) can be increased while reducing the polishing rate of a low-dielectric-constant insulating film.

Examples of the nonionic surfactant (C1) include a nonionic surfactant that includes at least one acetylene group (e.g., ethylene oxide adduct of acetylene glycol and acetylene alcohol), a silicone surfactant, an alkyl ether surfactant, polyvinyl alcohol, cyclodextrin, polyvinyl methyl ether, hydroxyethyl cellulose, and the like. These nonionic surfactants may be used either individually or in combination.

Among these, a nonionic surfactant that includes at least one acetylene group is preferable, with a nonionic surfactant shown by the following general formula (1) being more preferable.

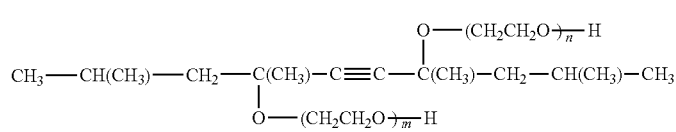

(1)

wherein m and n are individually integers equal to or larger than one, provided that m+n≦50 is satisfied.

The hydrophilic-lipophilic balance (HLB) can be adjusted by controlling m and n (the number of moles of ethylene oxide added) in the general formula (1). m and n in the general formula (1) preferably satisfy 20≦m+n≦50, and more preferably 20≦m+n≦40.

Examples of commercially available products of the nonionic surfactant shown by the general formula (1) include Surfynol 440 (HLB value=8), Surfynol 465 (HLB value=13), and Surfynol 485 (HLB value=17) (manufactured by Air Products Japan, Inc.).

The HLB value of the nonionic surfactant (C1) is preferably 5 to 20, and more preferably 8 to 17. If the HLB value of the nonionic surfactant (C1) is less than 5, the water-solubility of the nonionic surfactant may be too low.

When a chemical mechanical polishing aqueous dispersion includes silica particles having a high sodium content or a high potassium content, sodium or potassium derived from the silica particles may remain on the polishing target surface even when washed after polishing, so that the electrical characteristics of the device may deteriorate. It is conjectured that the nonionic surfactant (C1) easily adheres to the surface of a low-dielectric-constant insulating film that has relatively high hydrophobicity as compared with an ionic surfactant, although this tendency varies depending on the HLB value of the nonionic surfactant. This suppresses adhesion of sodium ions or potassium ions released from the silica particles during polishing to the low-dielectric-constant insulating film, so that sodium or potassium can be easily removed from the polishing target surface by washing. Moreover, since the nonionic surfactant has low molecular polarity, the nonionic surfactant can be easily removed by washing (i.e., does not remain on the polishing target surface). Therefore, the electrical characteristics of the device do not deteriorate.

The content of the nonionic surfactant (C1) is preferably 0.001 to 1.0 mass %, and more preferably 0.005 to 0.5 mass %, based on the total mass of the chemical mechanical polishing aqueous dispersion. If the content of the nonionic surfactant (C1) is within the above range, an appropriate polishing rate can be achieved while forming an excellent polished surface.

1.4 Water-Soluble Polymer (D1)

The chemical mechanical polishing aqueous dispersion according to this embodiment may include (D1) a water-soluble polymer having a weight average molecular weight of 50,000 to 5,000,000. It is known that a water-soluble polymer is added to a chemical mechanical polishing aqueous dispersion. A feature of the invention is using a water-soluble polymer having a weight average molecular weight higher than that of a water-soluble polymer normally added to a chemical mechanical polishing aqueous dispersion in order to reduce the polishing pressure applied to a low-dielectric-constant insulating film.

The weight average molecular weight of the water-soluble polymer (D1) refers to a polyethylene glycol-reduced weight average molecular weight (Mw) determined by gel permeation chromatography (GPC), for example. The weight average molecular weight (Mw) of the water-soluble polymer (D1) is 50,000 to 5,000,000, preferably 200,000 to 5,000,000, and more preferably 200,000 to 1,500,000. If the weight average molecular weight of the water-soluble polymer (D1) is within the above range, the polishing rate of an interlayer dielectric (cap layer) can be increased while significantly reducing polishing friction. Moreover, dishing or corrosion of a metal film can be suppressed so that a metal film can be stably polished. If the weight average molecular weight of the water-soluble polymer (D1) is less than 50,000, polishing friction may not be sufficiently reduced, or dishing or corrosion of a metal film may not be sufficiently suppressed. If the weight average molecular weight of the water-soluble polymer (D1) is more than 5,000,000, the stability of the chemical mechanical polishing aqueous dispersion may deteriorate, or the viscosity of the aqueous dispersion may unduly increase, so that load may be imposed on a polishing liquid supply apparatus, for example. In particular, precipitation due to aggregation of the abrasive grain component may occur when storing the aqueous dispersion for a long time, or the water-soluble polymer may precipitate due to a small change in storage temperature. This makes it difficult to obtain a stable polishing performance.

When a chemical mechanical polishing aqueous dispersion includes abrasive grains having a high sodium content or a high potassium content, sodium or potassium derived from the abrasive grains may remain on the polishing target surface even when washed after polishing, so that the electrical characteristics of the device may deteriorate. However, since the silica particles can be surrounded by adding the water-soluble polymer (D1), release of sodium or potassium from the silica particles can be suppressed. Moreover, the water-soluble polymer (D1) can absorb sodium or potassium that remains on the polishing target surface. Therefore, sodium or potassium can be removed from the polished surface by a simple washing operation, so that the polishing operation can be completed without causing a deterioration in electrical characteristics of the device.

Examples of the water-soluble polymer (D1) include thermoplastic resins such as polyacrylic acid, salts thereof, polymethacrylic acid, salts thereof, polyvinyl alcohol, polyvinylpyrrolidone, and polyacrylamide. The water-soluble polymer (D1) is preferably polymethacrylic acid that includes a carboxyl group in the repeating unit, a salt thereof, polyacrylic acid, a salt thereof, or a derivative thereof. Among these, polyacrylic acid and polymethacrylic acid are preferable since the stability of the abrasive grains is not affected. It is particularly preferable to use polyacrylic acid in order to provide the chemical mechanical polishing aqueous dispersion according to this embodiment with moderate viscosity.

The content of the water-soluble polymer (D1) is preferably 0.001 to 1.0 mass %, and more preferably 0.01 to 0.5 mass %, based on the total mass of the chemical mechanical polishing aqueous dispersion. If the content of the water-soluble polymer (D1) is less than 0.001 mass %, the polishing rate of a low-dielectric-constant interlayer dielectric may not be improved. If the content of the water-soluble polymer (D1) is more than 1.0 mass %, the silica particles may aggregate.

The ratio of the content of the organic acid (B) to the content of the water-soluble polymer (D1) is preferably 1:1 to 1:40, and more preferably 1:4 to 1:30. If the ratio of the content of the organic acid (B) to the content of the water-soluble polymer (D1) is within the above range, an appropriate polishing rate can be more reliably achieved while forming a flat polished surface.

1.5 Oxidizing Agent

The chemical mechanical polishing aqueous dispersion according to this embodiment may optionally include an oxidizing agent. Examples of the oxidizing agent include ammonium persulfate, potassium persulfate, hydrogen peroxide, ferric nitrate, cerium diammonium nitrate, iron sulfate, ozone, potassium periodate, peracetic acid, and the like. These oxidizing agents may be used either individually or in combination. Among these oxidizing agents, ammonium persulfate, potassium persulfate, and hydrogen peroxide are particularly preferable from the viewpoint of oxidizing power, compatibility with a protective film, handling capability, etc.

The content of the oxidizing agent is preferably 0.05 to 5 mass %, and more preferably 0.08 to 3 mass %, based on the total mass of the chemical mechanical polishing aqueous dispersion. If the content of the oxidizing agent is less than 0.05 mass %, a sufficient polishing rate may not be achieved. If the content of the oxidizing agent is more than 5 mass %, corrosion or dishing of a metal film (e.g., Cu film) may occur to a large extent.

1.6 pH

The pH of the chemical mechanical polishing aqueous dispersion according to this embodiment is preferably 6 to 12, more preferably 7 to 11.5, and particularly preferably 8 to 11. If the pH of the chemical mechanical polishing aqueous dispersion is less than 6, a hydrogen bond between the silanol groups present on the surface of the silica particles may not break, so that the silica particles may aggregate. If the pH of the chemical mechanical polishing aqueous dispersion is more than 12, defects may occur on a wafer due to high basicity. The pH of the chemical mechanical polishing aqueous dispersion may be adjusted by adding a pH adjusting agent such as a basic salt (e.g., potassium hydroxide, ammonia, ethylenediamine, or tetramethylammonium hydroxide (TMAH)), for example.

1.7 Production of Chemical Mechanical Polishing Aqueous Dispersion

The chemical mechanical polishing aqueous dispersion according to this embodiment may be produced by directly adding the silica particles (A), the organic acid (B1), and the additives to purified water, and mixing/stirring the mixture. The chemical mechanical polishing aqueous dispersion may be directly used, or a chemical mechanical polishing aqueous dispersion that includes each component at a high concentration (i.e. concentrated chemical mechanical polishing aqueous dispersion) may be prepared, and diluted to a desired concentration before use.

Alternatively, a plurality of liquids (e.g., two or three liquids) that respectively include at least one of the components may be prepared, and mixed before use. In this case, a chemical mechanical polishing aqueous dispersion may be prepared by mixing the plurality of liquids, and may be supplied to a chemical mechanical polishing apparatus. Alternatively, the plurality of liquids may be individually supplied to a chemical mechanical polishing apparatus to prepare a chemical mechanical polishing aqueous dispersion on a platen.

For example, a kit that includes a liquid (I) that includes water and the silica particles (A), and a liquid (II) that includes water and the organic acid (B) may be provided, the above chemical mechanical polishing aqueous dispersion being prepared by mixing the liquids (I) and (II).

The concentration of each component included in the liquids (I) and (II) is not particularly limited insofar as the concentration of each component in the chemical mechanical polishing aqueous dispersion prepared by mixing the liquids (I) and (II) falls within the above range. For example, the liquids (I) and (II) are prepared so that the liquids (I) and (II) contain each component at a concentration higher than that of the desired chemical mechanical polishing aqueous dispersion, optionally diluted before use, and mixed to obtain a chemical mechanical polishing aqueous dispersion in which the concentration of each component falls within the above range. Specifically, when mixing the liquids (I) and (II) in a weight ratio of 1:1, the liquids (I) and (II) may be prepared so that the concentration of each component is twice that of the desired chemical mechanical polishing aqueous dispersion. Alternatively, the liquids (I) and (II) may be prepared so that the concentration of each component is equal to or higher than twice that of the desired chemical mechanical polishing aqueous dispersion, and mixed in a weight ratio of 1:1. The mixture may be diluted with water so that each component is contained at the desired concentration. The storage stability of the aqueous dispersion can be improved by separately preparing the liquids (I) and (II).

When using the above kit, the liquids (I) and (II) may be mixed by an arbitrary method at an arbitrary timing insofar as the chemical mechanical polishing aqueous dispersion can be prepared before polishing. For example, the chemical mechanical polishing aqueous dispersion may be prepared by mixing the liquids (I) and (II), and supplied to a chemical mechanical polishing apparatus. Alternatively, the liquids (I) and (II) may be separately supplied to a chemical mechanical polishing apparatus, and mixed on a platen. Alternatively, the liquids (I) and (II) may be separately supplied to a chemical mechanical polishing apparatus, and mixed in a line of the chemical mechanical polishing apparatus, or mixed in a mixing tank that is provided in the chemical mechanical polishing apparatus. A line mixer or the like may be used to obtain a more uniform aqueous dispersion.

2. Second Chemical Mechanical Polishing Aqueous Dispersion

A second chemical mechanical polishing aqueous dispersion according to one embodiment of the invention is used to polish a copper film, the chemical mechanical polishing aqueous dispersion including (A) silica particles, and (B2) an amino acid, the sodium content, the potassium content, and the ammonium ion content of the silica particles (A) determined by ICP atomic emission spectrometry, ICP mass spectrometry, or ammonium ion quantitative analysis using ion chromatography have a relationship in which the sodium content is 5 to 500 ppm and at least one of the potassium content and the ammonium ion content is 100 to 20,000 ppm. Each component of the chemical mechanical polishing aqueous dispersion according to this embodiment is described below.

2.1 Silica Particles (A)

The chemical mechanical polishing aqueous dispersion according to this embodiment includes the silica particles (A). The silica particles (A) are the same as the silica particles (A) used for the first chemical mechanical polishing aqueous dispersion. Therefore, further description is omitted.

2.2 Amino Acid (B2)

The chemical mechanical polishing aqueous dispersion according to this embodiment includes the amino acid (B2). The amino acid (B2) is preferably at least one amino acid selected from glycine, alanine, and histidine. The amino acid easily forms a coordinate bond with a copper ion. Therefore, the amino acid forms a coordinate bond with the surface of a copper film (i.e., polishing target surface). This ensures that the chemical mechanical polishing aqueous dispersion prevents surface roughness of the copper film, and increases the polishing rate of the copper film due to improved affinity with copper and a copper ion while maintaining excellent flatness. Since the amino acid can be easily coordinated with a copper ion dissolved in a slurry when the copper film is polished, precipitation of copper can be prevented. As a result, polishing defects (e.g., scratches) that may occur on the copper film can be suppressed. The amino acid can also efficiently capture unnecessary metal from the polished surface. When adding a water-soluble polymer (D2) described later to the chemical mechanical polishing aqueous dispersion, the water-soluble polymer (D2) may adhere to the polishing target surface (i.e., hinder polishing) depending on the type or the amount of the water-soluble polymer (D2), so that the polishing rate may decrease. In this case, the polishing rate of a copper film can be increased by utilizing the amino acid (B2) in combination with the water-soluble polymer. The amino acid (B2) also suppresses adhesion of sodium ions or potassium ions released from the silica particles during polishing to the surface of a copper film, so that sodium or potassium can be efficiently removed from the polishing target surface.

The content of the amino acid (B2) is preferably 0.001 to 3.0 mass %, and more preferably 0.01 to 2.0 mass %, based on the total mass of the chemical mechanical polishing aqueous dispersion. If the content of the amino acid is less than 0.001 mass %, the amount of dishing of a copper film may not be suppressed to 20 nm or less. If the content of the amino acid is more than 3.0 mass %, the silica particles may aggregate.

2.3 Anionic Surfactant (C2)

The chemical mechanical polishing aqueous dispersion according to this embodiment may include (C2) an anionic surfactant. When a chemical mechanical polishing aqueous dispersion includes abrasive grains having a high sodium content or a high potassium content, sodium or potassium derived from the abrasive grains may remain on the polishing target surface even when washed after polishing, so that the electrical characteristics of the device may deteriorate. The anionic surfactant (C2) is considered to selectively adhere to copper as compared with a cation (e.g., sodium ion or potassium ion) due to high affinity with copper and a copper ion, so that the surface of the copper film is protected. This effectively suppresses adhesion of sodium ions or potassium ions released from the abrasive grains during polishing to the polishing target surface. Therefore, even when the chemical mechanical polishing aqueous dispersion utilizes an alkali silicate aqueous solution (water glass) (i.e., an alkali metal (e.g., sodium) remains in the silica particles as impurities), sodium or potassium can be removed from the polished surface by a simple washing operation, so that chemical mechanical polishing can be implemented without unduly contaminating a copper interconnect.

The anionic surfactant (C2) is considered to adhere to the surface of the silica particles, and improve the dispersion stability of the silica particles. This improves the storage stability of the particles, and significantly reduces the number of scratches that are considered to be caused by aggregated particles.

The content of the anionic surfactant (C2) is preferably 0.0001 to 2.0 mass %, and more preferably 0.0005 to 1.0 mass %, based on the total mass of the chemical mechanical polishing aqueous dispersion. If the content of the anionic surfactant (C2) is less than 0.0001 mass %, the surface of the copper film may not be sufficiently protected, so that corrosion or excessive etching may occur. As a result, dishing or erosion may occur. If the content of the anionic surfactant (C2) is more than 2.0 mass %, the surface of the copper film may be unduly protected, so that a sufficient polishing rate may not be obtained. As a result, copper may remain unpolished. Moreover, the silica particles may aggregate (e.g., bubbles may occur to a large extent).

The anionic surfactant (C2) preferably includes at least one functional group selected from a carboxyl group, a sulfonic acid group, a phosphoric acid group, and ammonium salts and metal salts of these functional groups. Examples of the anionic surfactant (C2) include fatty acid salts, alkyl sulfates, alkyl ether sulfate salts, alkyl ester carboxylates, alkylbenzenesulfonates, linear alkylbenzenesulfonates, alpha-sulfofatty acid ester salts, alkyl polyoxyethylene sulfates, alkyl phosphates, monoalkyl phosphate salts, naphthalenesulfonates, alpha-olefin sulfonates, alkanesulfonates, alkenyl succinates, and the like. Among these, alkylbenzenesulfonates, linear alkylbenzenesulfonates, naphthalenesulfonates, and alkenylsuccinates are preferable. These anionic surfactants may be used either individually or in combination.

The anionic surfactant (C2) is particularly preferably an alkenylsuccinate shown by the following general formula (2).

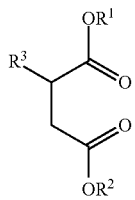

(2)

wherein $R^1$ and $R^2$ individually represent a hydrogen atom, a metal atom, or a substituted or unsubstituted alkyl group. When $R^1$ or $R^2$ represents an alkyl group, the alkyl group is preferably a substituted or unsubstituted alkyl group having 1 to 8 carbon atoms. When $R^1$ or $R^2$ represents a metal atom, the metal atom is preferably an alkali metal atom, and more preferably sodium or potassium. $R^3$ represents a substituted or unsubstituted alkenyl group or a sulfonic acid group (—$SO_3X$). When $R^3$ represents an alkenyl group, the alkenyl group is preferably a substituted or unsubstituted alkenyl group having 1 to 8 carbon atoms. When $R^3$ represents a sulfonic acid group (—$SO_3X$), X represents a hydrogen ion, an ammonium ion, or a metal ion. When X represents a metal ion, X preferably represents a sodium ion or a potassium ion.

Examples of commercially available products of the compound shown by the general formula (2) include Newcol 291-M (manufactured by Nippon Nyukazai Co., Ltd.) ($R^3$ is a sulfonic acid group (—$SO_3X$)), Newcol 292-PG (manufactured by Nippon Nyukazai Co., Ltd.), Pelex TA (manufactured by Kao Corporation), Latemul ASK (manufactured by Nippon Nyukazai Co., Ltd.) (dipotassium alkenylsuccinate), and the like.

The compound shown by the general formula (2) effectively adheres to the surface of a copper film to protect the copper film from excessive etching and corrosion. This makes it possible to obtain a flat polished surface.

The inventors found that it is most effective to use ammonium dodecylbenzenesulfonate (i.e., alkylbenzenesulfonate) and dipotassium alkenylsuccinate (i.e., alkenylsuccinate) in combination as the anionic surfactant (C2).

2.4 Water-Soluble Polymer (D2)

The chemical mechanical polishing aqueous dispersion according to this embodiment preferably includes (D2) a water-soluble polymer that has a weight average molecular weight of 10,000 to 1,500,000, and has properties of a Lewis base. The water-soluble polymer (D2) that has properties of a Lewis base easily adheres to (is coordinated with) the surface of a copper film to suppress dishing and corrosion of the copper film.

The water-soluble polymer (D2) preferably has at least one molecular structure selected from a nitrogen-containing heterocyclic ring and a cationic functional group. The cationic functional group is preferably an amino group. The nitrogen-containing heterocyclic ring and the cationic functional group have properties of a Lewis base, and easily adhere to (are coordinated with) the surface of a copper film to suppress dishing and corrosion of the copper film. Since the nitrogen-containing heterocyclic ring and the cationic functional group can be easily removed by washing, the polishing target is not contaminated.

The water-soluble polymer (D2) is preferably a homopolymer that includes a nitrogen-containing monomer as a repeating unit, or a copolymer that includes a nitrogen-containing monomer as a repeating unit. Examples of the nitrogen-containing monomer include N-vinylpyrrolidone, (meth)acrylamide, N-methylolacrylamide, N-2-hydroxyethylacrylamide, acryloylmorpholine, N,N-dimethylaminopropylacrylamide, a diethyl sulfate salt thereof, N,N-dimethylacrylamide, N-isopropylacrylamide, N-vinylacetamide, N,N-dimethylaminoethylmethacrylic acid, a diethyl sulfate salt thereof, and N-vinylformamide. Among these, N-vinylpyrrolidone that includes a nitrogen-containing heterocyclic five-membered ring in the molecular structure is particularly preferable. N-Vinylpyrrolidone easily forms a coordinate bond with a copper ion via the nitrogen atom on the ring to improve affinity with copper and a copper ion, and adheres to the surface of a copper film to moderately protect the copper film.

When the water-soluble polymer (D2) is a copolymer that includes a nitrogen-containing monomer as a repeating unit, all of the monomers need not necessarily be nitrogen-containing monomers. It suffices that the water-soluble polymer (D2) include at least one nitrogen-containing monomer. Examples of a monomer copolymerizable with the nitrogen-containing monomer include acrylic acid, methacrylic acid, methyl acrylate, methyl methacrylate, vinyl ethyl ether, divinylbenzene, vinyl acetate, styrene, and the like.

The water-soluble polymer (D2) is preferably a homopolymer or a copolymer that includes a cationic functional group. For example, the water-soluble polymer (D2) may be a homopolymer or a copolymer that includes at least one of repeating units shown by the following general formulas (4) and (5) (hereinafter may be referred to as "specific polymer").

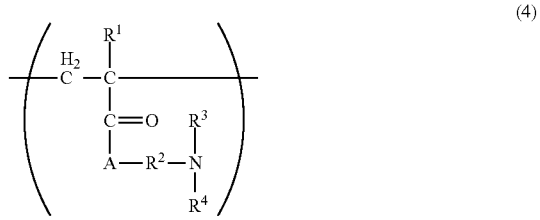

(4)

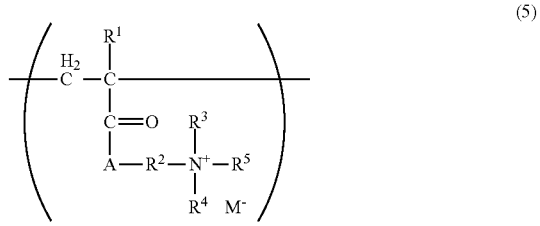

(5)

wherein $R^1$ represents a hydrogen atom or a substituted or unsubstituted alkyl group having 1 to 6 carbon atoms, $R^2$ represents a substituted or unsubstituted methylene group or a substituted or unsubstituted alkylene group having 2 to 8 carbon atoms, $R^3$, $R^4$, and $R^5$ individually represent a hydrogen atom, or a substituted or unsubstituted alkyl group having 1 to 10 carbon atoms, A represents a single bond, —O—, or —NH—, and $M^-$ represents an anion.

A in the repeating units shown by the general formulas (4) and (5) represents —O— or —NH—, and preferably —O—. When A is —NH—, the stability of the silica particles deteriorates due to the content of the specific polymer or other components, so that the abrasive grains may precipitate during long-time storage. In this case, the abrasive grains must be re-dispersed by ultrasonic dispersion or the like before use. This impairs workability.

The counter anion (M⁻) is preferably a halide ion, an organic anion, or an inorganic anion. The counter anion (M⁻) is more preferably a hydroxide ion, a chloride ion, a bromide ion, a conjugate base $NH_2^-$ of $NH_3$, an alkyl sulfate ion, a perchlorate ion, a hydrogensulfate ion, an acetate ion, or an alkylbenzenesulfonic acid ion. The counter anion (M⁻) is still more preferably a chloride ion, an alkyl sulfate ion, a hydrogensulfate ion, an acetate ion, or an alkylbenzenesulfonic acid ion. It is particularly preferable to use an alkyl sulfate ion since contamination of the polishing target due to a metal can be prevented by utilizing an organic anion, and an organic anion can be easily removed after polishing.

The specific polymer is more preferably a copolymer that includes a repeating unit shown by the following general formula (6). A copolymer that includes the repeating unit shown by the general formula (6) may be a polymer in which the repeating units shown by the general formulas (4) and (5) and the repeating unit shown by the general formula (6) are randomly bonded, or a block copolymer of the repeating units shown by the general formulas (4) and (5) and the repeating unit shown by the general formula (6).

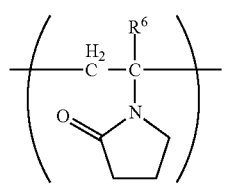

(6)

wherein $R^6$ represents a hydrogen atom or a substituted or unsubstituted alkyl group having 1 to 6 carbon atoms.

When the specific polymer is a copolymer that includes the repeating unit shown by the general formula (4) and the repeating unit shown by the general formula (5), a sufficient performance can be obtained when the molar ratio n/m of the number of moles "n" of the repeating unit shown by the general formula (4) to the number of moles "m" of the repeating unit shown by the general formula (5) is 10/0 to 0/10. An excellent performance can be obtained when the ratio n/m is 10/0 to 1/9, more preferably 10/0 to 2/8, and particularly preferably 9/1 to 3/7.

The content of the repeating unit shown by the general formula (4) and the content of the repeating unit shown by the general formula (5) may be calculated from the amount of monomer that includes an amino group and the degree of neutralization, or may be measured by titration of the specific polymer using an acid or a base.

When the specific polymer is a copolymer that includes the repeating unit shown by the general formula (4) or (5) and the repeating unit shown by the general formula (6), an excellent performance can be obtained when the molar ratio q/p of the number of moles "q" of the repeating unit shown by the general formula (6) to the number of moles "p" of the repeating unit shown by the general formula (4) or (5) is 9/1 to 1/9.

The amino group content of the specific polymer calculated from the amount of monomer is 0 to 0.100 mol/g, preferably 0.0005 to 0.010 mol/g, and more preferably from 0.002 to 0.006 mol/g.

The cationic functional group content of the specific polymer calculated from the amount of monomer is 0 to 0.100 mol/g, preferably 0.0005 to 0.010 mol/g, and more preferably from 0.002 to 0.006 mol/g.

The weight average molecular weight of the water-soluble polymer (D2) refers to a polyethylene glycol-reduced weight average molecular weight (Mw) determined by gel permeation chromatography (GPC), for example. The weight average molecular weight (Mw) of the water-soluble polymer (D2) is 10,000 to 1,500,000, and preferably 40,000 to 1,200,000. If the water-soluble polymer (D2) has a weight average molecular weight within the above range, polishing friction can be reduced, so that dishing and erosion of a copper film can be suppressed. Moreover, a copper film can be stably polished. If the water-soluble polymer (D2) has a weight average molecular weight of less than 10,000, polishing friction can be reduced to only a small extent, so that dishing and erosion of a copper film may not be suppressed. If the water-soluble polymer (D2) has a weight average molecular weight of more than 1,500,000, the dispersion stability of the silica particles may be impaired, the silica particles may aggregate, and the number of scratches of a copper film may increase. Moreover, the viscosity of the chemical mechanical polishing aqueous dispersion may unduly increase, so that load may be imposed on a slurry supply apparatus, for example. When polishing a fine interconnect pattern, copper may significantly remain on the pattern.

The content of the water-soluble polymer (D2) is preferably 0.001 to 1.0 mass %, and more preferably 0.01 to 0.5 mass %, based on the total mass of the chemical mechanical polishing aqueous dispersion. If the content of the water-soluble polymer is less than 0.001 mass %, dishing of a copper film may not be effectively suppressed. If the content of the water-soluble polymer is more than 1.0 mass %, the silica particles may aggregate, or the polishing rate may decrease.

When a chemical mechanical polishing aqueous dispersion includes abrasive grains having a high sodium content or a high potassium content, sodium or potassium derived from the abrasive grains may remain on the polishing target surface even when washed after polishing, so that the electrical characteristics of the device may deteriorate. Since the water-soluble polymer (D2) has properties of a Lewis base, the water-soluble polymer (D2) is efficiently coordinated with the surface of a copper film (polishing target surface). Therefore, the surface of the copper film is effectively protected so that adhesion of sodium or potassium to the surface of the copper film can be suppressed (i.e., sodium or potassium can be easily removed from the surface of the copper film by washing). Since the water-soluble polymer can be easily removed by washing (i.e., does not remain on the surface of the copper film), the electrical characteristics of the device do not deteriorate.

2.5 Organic Acid that Includes Nitrogen-Containing Heterocyclic Ring and Carboxyl Group The chemical mechanical polishing aqueous dispersion according to this embodiment may include an organic acid that includes a nitrogen-containing heterocyclic ring and a carboxyl group. The organic acid that includes a nitrogen-containing heterocyclic ring and a carboxyl group improves the effects of the amino acid (B2) when used in combination with the amino acid (B2). Examples of the organic acid that includes a nitrogen-containing heterocyclic ring and a carboxyl group include an organic acid that includes a heterocyclic six-membered ring that includes at least one nitrogen atom, an organic acid that includes a hetero compound that includes a heterocyclic five-membered ring, and the like. Specific examples of the organic acid include quinaldic acid, quinolinic acid, quinoline-8-carboxylic acid, picolinic acid, xanthurenic acid, kynurenic acid, nicotinic acid, anthranilic acid, and the like.

The content of the organic acid that includes a nitrogen-containing heterocyclic ring and a carboxyl group is preferably 0.001 to 3.0 mass %, and more preferably 0.01 to 2.0 mass %, based on the total mass of the chemical mechanical polishing aqueous dispersion. If the content of the organic acid that includes a nitrogen-containing heterocyclic ring and a carboxyl group is less than 0.001 mass %, dishing of a copper film may occur. If the content of the organic acid that includes a nitrogen-containing heterocyclic ring and a carboxyl group is more than 3.0 mass %, the silica particles may aggregate.

2.6 Oxidizing Agent

The chemical mechanical polishing aqueous dispersion according to this embodiment may optionally include an oxidizing agent. Examples of the oxidizing agent include ammonium persulfate, potassium persulfate, hydrogen peroxide, ferric nitrate, cerium diammonium nitrate, iron sulfate, ozone, potassium periodate, peracetic acid, and the like. These oxidizing agents may be used either individually or in combination. Among these oxidizing agents, ammonium persulfate, potassium persulfate, and hydrogen peroxide are particularly preferable from the viewpoint of oxidizing power, compatibility with a protective film, handling capability, etc. The content of the oxidizing agent is preferably 0.05 to 5 mass %, and more preferably 0.08 to 3 mass %, based on the total mass of the chemical mechanical polishing aqueous dispersion. If the content of the oxidizing agent is less than 0.05 mass %, a copper film may not be polished at a sufficient polishing rate. If the content of the oxidizing agent is more than 5 mass %, dishing and corrosion of a copper film may occur.

2.7 pH

The pH of the chemical mechanical polishing aqueous dispersion according to this embodiment is preferably 6 to 12, more preferably 7 to 11.5, and particularly preferably 8 to 11. If the pH of the chemical mechanical polishing aqueous dispersion is less than 6, a hydrogen bond between the silanol groups present on the surface of the silica particles may not break, so that the silica particles may aggregate. If the pH of the chemical mechanical polishing aqueous dispersion is more than 12, defects may occur on a wafer due to high basicity. The pH of the chemical mechanical polishing aqueous dispersion may be adjusted by adding a pH adjusting agent such as a basic salt (e.g., potassium hydroxide, ammonia, ethylenediamine, or tetramethylammonium hydroxide (TMAH)), for example.

2.8 Application

The chemical mechanical polishing aqueous dispersion according to this embodiment may be suitably used to chemically and mechanically polish a polishing target (e.g., semiconductor device) that includes a copper film formed on the surface. Specifically, the chemical mechanical polishing aqueous dispersion according to this embodiment that includes the amino acid (B2) prevents surface roughness of the copper film, and increases the polishing rate of the copper film due to improved affinity with copper and a copper ion while maintaining excellent flatness. Therefore, the copper film of the surface of the polishing target can be selectively polished at high speed without causing defects of the copper film and a low-dielectric-constant insulating film under normal polishing pressure conditions. Moreover, the chemical mechanical polishing aqueous dispersion according to this embodiment suppresses contamination of a wafer due to a metal.

Specifically, the chemical mechanical polishing aqueous dispersion according to this embodiment may be applied to a step (first polishing step) that removes a copper film on a barrier metal film by chemical mechanical polishing when producing a semiconductor device that utilizes a low-dielectric-constant insulating film (i.e., insulating film) and copper or a copper alloy (i.e., interconnect material) by the damascene process.

Note that the term "copper film" used herein refers to a film formed of copper or a copper alloy. The copper content of the copper film is preferably 95 mass % or more.

2.9 Production of Chemical Mechanical Polishing Aqueous Dispersion

The chemical mechanical polishing aqueous dispersion according to this embodiment may be produced by directly adding the silica particles (A), the amino acid (B2), and the additives to purified water, and mixing/stirring the mixture. The chemical mechanical polishing aqueous dispersion may be directly used, or a chemical mechanical polishing aqueous dispersion that includes each component at a high concentration (i.e. concentrated chemical mechanical polishing aqueous dispersion) may be prepared, and diluted to a desired concentration before use.

Alternatively, a plurality of liquids (e.g., two or three liquids) that respectively include at least one of the components may be prepared, and mixed before use. In this case, a chemical mechanical polishing aqueous dispersion may be prepared by mixing the plurality of liquids, and supplied to a chemical mechanical polishing apparatus. Alternatively, the plurality of liquids may be individually supplied to a chemical mechanical polishing apparatus to prepare a chemical mechanical polishing aqueous dispersion on a platen.

For example, a kit that includes a liquid (I) that includes water and the silica particles (A), and a liquid (II) that includes water and the amino acid (B2) may be provided, the above chemical mechanical polishing aqueous dispersion being prepared by mixing the liquids (I) and (II).

The concentration of each component included in the liquids (I) and (II) is not particularly limited insofar as the concentration of each component in the chemical mechanical polishing aqueous dispersion prepared by mixing the liquids (I) and (II) falls within the above range. For example, the liquids (I) and (II) are prepared so that the liquids (I) and (II) contain each component at a concentration higher than that of the desired chemical mechanical polishing aqueous dispersion, optionally diluted before use, and mixed to obtain a chemical mechanical polishing aqueous dispersion in which the concentration of each component falls within the above range. Specifically, when mixing the liquids (I) and (II) in a weight ratio of 1:1, the liquids (I) and (II) may be prepared so that the concentration of each component is twice that of the desired chemical mechanical polishing aqueous dispersion. Alternatively, the liquids (I) and (II) may be prepared so that the concentration of each component is equal to or higher than twice that of the desired chemical mechanical polishing aqueous dispersion, and mixed in a weight ratio of 1:1. The mixture may be diluted with water so that each component is contained at the desired concentration. The storage stability of the aqueous dispersion can be improved by separately preparing the liquids (I) and (II).

When using the above kit, the liquids (I) and (II) may be mixed by an arbitrary method at an arbitrary timing insofar as the chemical mechanical polishing aqueous dispersion can be prepared before polishing. For example, the chemical mechanical polishing aqueous dispersion may be prepared by mixing the liquids (I) and (II), and supplied to a chemical mechanical polishing apparatus. Alternatively, the liquids (I) and (II) may be separately supplied to a chemical mechanical polishing apparatus, and mixed on a platen. Alternatively, the liquids (I) and (II) may be separately supplied to a chemical mechanical polishing apparatus, and mixed in a line of the chemical mechanical polishing apparatus, or mixed in a mixing tank that is provided in the chemical mechanical polishing apparatus. A line mixer or the like may be used to obtain a more uniform aqueous dispersion.

3. Chemical Mechanical Polishing Method

A specific example of a chemical mechanical polishing method according to one embodiment of the invention is described in detail below with reference to the drawings.

3.1 Polishing Target

Figure 4:
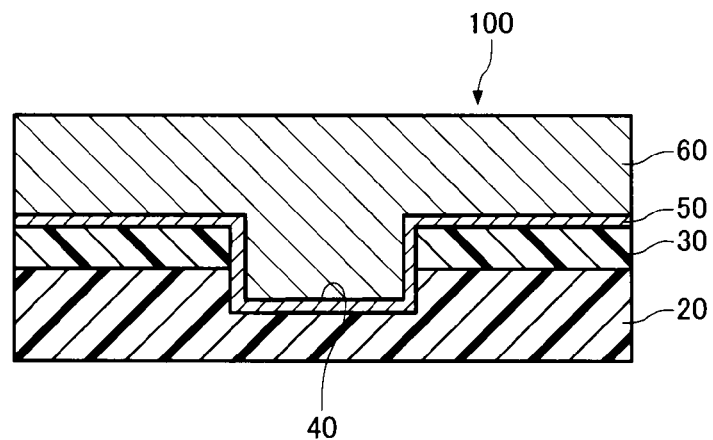
FIG. 4 is a cross-sectional view illustrating a polishing target used for a chemical mechanical polishing method according to one embodiment of the invention.

FIG. 4 shows a polishing target 100 that is used for the chemical mechanical polishing method according to this embodiment.

(1) A low-dielectric-constant insulating film 20 is formed by a coating method or a plasma CVD method. The low-dielectric-constant insulating film 20 may be an inorganic insulating film or an organic insulation film. Examples of the inorganic insulating film include an SiOF film (k=3.5 to 3.7), an Si—H-containing $SiO_2$ film (k=2.8 to 3.0), and the like. Examples of the organic insulation film include a carbon-containing $SiO_2$ film (k=2.7 to 2.9), a methyl group-containing $SiO_2$ film (k=2.7 to 2.9), a polyimide film (k=3.0 to 3.5), a parylene film (k=2.7 to 3.0), a Teflon (registered trademark) film (k=2.0 to 2.4), amorphous carbon (k=<2.5), and the like (k is the dielectric constant).

(2) An insulating film 30 is formed on the low-dielectric-constant insulating film 20 using a CVD method or a thermal oxidation method. Examples of the insulating film 30 include a TEOS film and the like.

(3) The low-dielectric-constant insulating film 20 and the insulating film 30 are etched to form an interconnect depression 40.

(4) A barrier metal film 50 is formed using a CVD method to cover the surface of the insulating film 30, and the bottom and the inner wall surface of the interconnect depression 40. The barrier metal film 50 is preferably formed of Ta or TaN due to excellent adhesion to a copper film and excellent diffusion barrier properties for a copper film.

(5) Copper is deposited on the barrier metal film 50 to form a copper film 60. The polishing target 100 is thus obtained.

3.2 Chemical Mechanical Polishing Method 3.2.1 First Step

Figure 5:
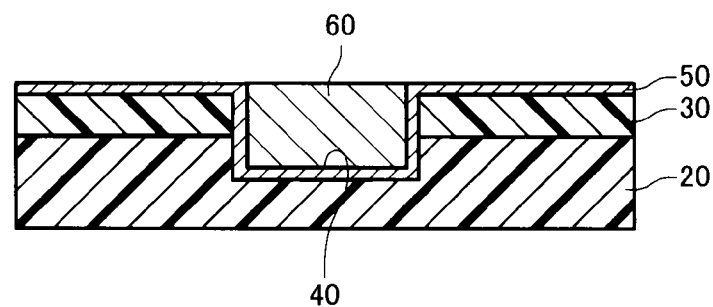
FIG. 5 is a cross-sectional view illustrating a polishing step of a chemical mechanical polishing method according to the invention.

The copper film 60 deposited on the barrier metal film 50 of the polishing target 100 is removed by chemical mechanical polishing using the second chemical mechanical polishing aqueous dispersion. The copper film 60 is polished until the barrier metal film 50 is exposed. It is normally necessary to stop polishing after confirming the barrier metal film 50 has been exposed. The second chemical mechanical polishing aqueous dispersion polishes the copper film at a very high polishing rate, but polishes the barrier metal film to only a small extent. Therefore, since chemical mechanical polishing does not proceed when the barrier metal film 50 has been exposed, chemical mechanical polishing self-stops, as shown in FIG. 5.

In the first step, a commercially available chemical mechanical polishing apparatus may be used. Examples of a commercially available chemical mechanical polishing apparatus include EPO-112, EPO-222 (manufactured by Ebara Corporation), LGP510, LGP552 (manufactured by Lapmaster SFT), Mirra (manufactured by Applied Materials), and the like.

The polishing conditions preferably employed in the first step are appropriately set depending on the chemical mechanical polishing apparatus. For example, when using a chemical mechanical polishing apparatus "EPO-112", the first step may be performed under the following conditions.

Platen rotational speed: preferably 30 to 120 rpm, and more preferably 40 to 100 rpm Head rotational speed: preferably 30 to 120 rpm, and more preferably 40 to 100 rpm Ratio of platen rotational speed/head rotational speed: preferably 0.5 to 2, and more preferably 0.7 to 1.5

Polishing pressure: preferably 60 to 200 $g/cm^2$, and more preferably 100 to 150 $g/cm^2$ Dispersion supply rate: preferably 50 to 400 ml/min, and more preferably 100 to 300 ml/min In the first step, since a polished surface that exhibits excellent flatness is obtained while allowing chemical mechanical polishing to self-stop without polishing the copper film to a large extent, a load sustained by the insulating film 30 and the low-dielectric-constant insulating film 20 in the lower layer can be reduced.

3.2.2 Second Step

Figure 6:
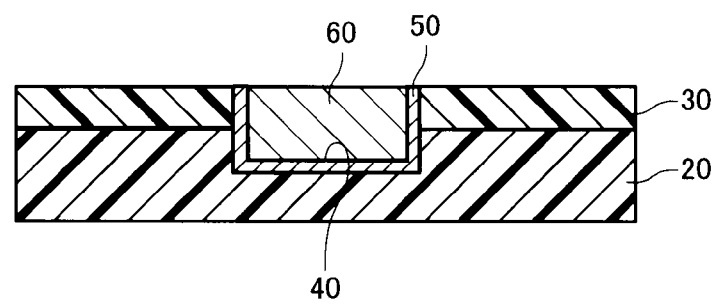
FIG. 6 is a cross-sectional view illustrating a polishing step of a chemical mechanical polishing method according to the invention.
Figure 7:
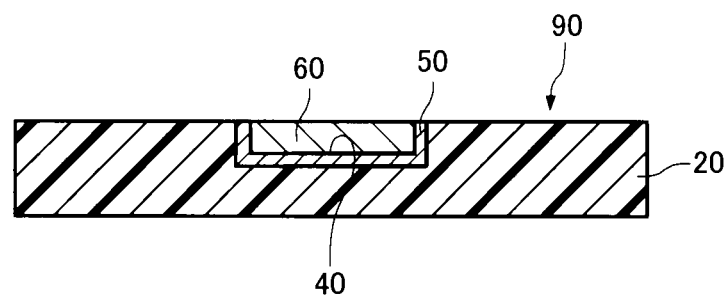
FIG. 7 is a cross-sectional view illustrating a polishing step of a chemical mechanical polishing method according to the invention.

The barrier metal film 50 and the copper film 60 are chemically and mechanically polished at the same time using the first chemical mechanical polishing aqueous dispersion. As shown in FIG. 6, chemical mechanical polishing is performed after the insulating film 30 has been exposed to remove the insulating film 30. As shown in FIG. 7, chemical mechanical polishing is stopped when the low-dielectric-constant insulating film 20 has been exposed. A semiconductor device 90 is thus obtained.

In the second step, a commercially available chemical mechanical polishing apparatus may be used in the same manner as in the first step.

The polishing conditions preferably employed in the second step are appropriately set depending on the chemical mechanical polishing apparatus. For example, when using a chemical mechanical polishing apparatus "EPO-112", the second step may be performed under the following conditions.

Platen rotational speed: preferably 30 to 120 rpm, and more preferably 40 to 100 rpm Head rotational speed: preferably 30 to 120 rpm, and more preferably 40 to 100 rpm Ratio of platen rotational speed/head rotational speed: preferably 0.5 to 2, and more preferably 0.7 to 1.5

Polishing pressure: preferably 60 to 200 $g/cm^2$, and more preferably 100 to 150 $g/cm^2$ Dispersion supply rate: preferably 50 to 300 ml/min, and more preferably 100 to 200 ml/min

4. Examples

The invention is further described below by way of examples. Note that the invention is not limited to the following examples.

4.1 Preparation of Silica Particle Dispersion

No. 3 water glass (silica concentration: 24 mass %) was diluted with water to prepare a diluted sodium silicate aqueous solution having a silica concentration of 3.0 mass %. The diluted sodium silicate aqueous solution was passed through a hydrogen cation-exchange resin layer to obtain an active silica aqueous solution (pH: 3.1) from which most of the sodium ions were removed. The pH of the active silica aqueous solution was immediately adjusted to 7.2 by adding a 10 mass % potassium hydroxide aqueous solution with stirring. The mixture was then boiled and aged for three hours. The active silica aqueous solution having a pH of 7.2 was gradually added to the resulting aqueous solution (10:1) over six hours so that the average particle diameter of the silica particles increased to 26 nm.

The aqueous dispersion including the silica particles was concentrated under vacuum (boiling point: 78° C.) to obtain a concentrated silica particle dispersion (silica concentration: 32 mass %, average particle diameter of silica: 26 nm, pH: 9.8). This silica particle dispersion was passed through the hydrogen cation-exchange resin layer to remove most of the sodium ions. A 10 mass % potassium hydroxide aqueous solution was then added to the dispersion to obtain a silica particle dispersion A (silica particle concentration: 28.0 mass %, pH: 10.0).

The silica particles were collected from the silica particle dispersion A by centrifugation. The silica particles thus collected were dissolved in diluted hydrofluoric acid. The sodium content and the potassium content were measured by ICP-MS ("ELAN DRC PLUS" manufactured by PerkinElmer). The ammonium ion content was measured by ion chromatography ("ICS-1000" manufactured by DIONEX). The sodium content was 88 ppm, the potassium content was 5500 ppm, and the ammonium ion content was 5 ppm.

The silica particle dispersion A was diluted with ion-exchanged water to a concentration of 0.01%. A droplet of the dispersion was placed on a collodion film having a Cu grid (mesh size: 150 micrometers), and dried at room temperature. A sample was thus prepared on the Cu grid so that the particle shape was maintained. An image of the particles was photographed using a transmission electron microscope ("H-7650" manufactured by Hitachi High-Technologies Corporation) (magnification: 20,000) to measure the major axis and the minor axis of each of fifty colloidal silica particles. The average major axis and the average minor axis were calculated. The ratio (Rmax/Rmin) of the average major axis (Rmax) to the average minor axis (Rmin) was 1.1.

The average particle diameter of the colloidal silica particles calculated by the BET method from the specific surface area was 26 nm. The specific surface area of the colloidal silica particles was calculated by the BET method using the silica particles collected by concentrating the silica particle dispersion A and evaporating the resulting product to dryness.

Silica particle dispersions B to E and H to J were obtained in the same manner as described above, except for changing the aging time, the type and the amount of the basic compound, etc. A silica particle dispersion F was prepared by a known sol-gel method using tetraethoxysilane as a raw material. A silica particle dispersion G was prepared by preparing a dispersion in the same manner as described above, and subjecting the dispersion to a hydrothermal treatment (i.e., the autoclave treatment was performed for a longer time to promote silanol condensation). The property values of the silica particle dispersions A to J thus prepared are summarized in Table 2.

4.2 Synthesis of Water-Soluble Polymer 4.2.1 Preparation of Polyvinylpyrrolidone Aqueous Solution A flask was charged with 60 g of N-vinyl-2-pyrrolidone, 240 g of water, 0.3 g of a 10 mass % sodium sulfite aqueous solution, and 0.3 g of a 10 mass % t-butyl hydroperoxide aqueous solution. The mixture was stirred at 60° C. for 5 hours in a nitrogen atmosphere to produce polyvinylpyrrolidone (K30). The polyethylene glycol-reduced weight average molecular weight (Mw) of the polyvinylpyrrolidone (K30) determined by gel permeation chromatography (instrument: "HCL-8120" manufactured by Tosoh Corp., column: "TSK-GEL alpha-M", eluant: NaCl aqueous solution/acetonitrile) was 40,000. The amino group content and the cationic functional group content calculated from the amount of the monomer were 0 mol/g.

Polyvinylpyrrolidone (K60) and polyvinylpyrrolidone (K90) were produced in the same manner as described above, except for appropriately adjusting the amount of component, the reaction temperature, and the reaction time. The weight average molecular weights (Mw) of the polyvinylpyrrolidone (K60) and the polyvinylpyrrolidone (K90) measured in the same manner as described above were 700,000 and 1,200,000, respectively. The amino group content and the cationic functional group content calculated from the amount of the monomer were 0 mol/g.

4.2.2 Vinylpyrrolidone/Diethylaminomethyl Methacrylate Copolymer

A flask equipped with a reflux condenser, a dropping funnel, a thermometer, a nitrogen replacement glass tube, and a stirrer was charged with 70 parts by mass of diethylaminomethyl methacrylate, 5 parts by mass of cetyl acrylate, 10 parts by mass of stearyl methacrylate, 10 parts by mass of N-vinylpyrrolidone, 5 parts by mass of butyl methacrylate, and 100 parts by mass of isopropyl alcohol. After the addition of 0.3 parts by mass of azobisisobutyronitrile (AIBN), the mixture was polymerized at 60° C. for 15 hours under a nitrogen stream. After the addition of diethyl sulfate (0.35 mol per mol of diethylaminoethyl methacrylate), the mixture was refluxed at 50° C. for 10 hours under a nitrogen stream to synthesize a vinylpyrrolidone/diethylaminomethyl methacrylate copolymer.

The polyethylene glycol-reduced weight average molecular weight (Mw) of the copolymer determined by gel permeation chromatography (instrument: "HCL-8120" manufactured by Tosoh Corp., column: "TSK-GEL alpha-M", eluant: NaCl aqueous solution/acetonitrile) was 100,000. The amino group content and the cationic functional group content calculated from the amount of the monomers were 0.001 mol/g and 0.0006 mol/g, respectively.

TABLE 2

| Silica particle dispersion | Silica concentration (wt %) | pH | Average particle diameter (nm) | Sodium concentration (ppm) | Potassium concentration (ppm) | Ammonium concentration (ppm) | Rmax/Rmin |
|---|---|---|---|---|---|---|---|
| A | 28.0 | 10.0 | 26 | 88 | 5500 | 5 | 1.1 |
| B | 32.0 | 9.8 | 45 | 171 | 3280 | 2 | 1.2 |
| C | 28.0 | 9.8 | 18 | 43 | 7000 | 8 | 1.2 |
| D | 35.0 | 10.2 | 80 | 230 | 7600 | 2 | 1.1 |
| E | 32.0 | 10.1 | 45 | 184 | 2 | 2190 | 1.0 |
| F | 15.0 | 7.2 | 15 | <1 | <1 | 80 | 1.7 |
| G | 28.0 | 10.0 | 26 | 11250 | 5 | 5 | 1.1 |
| H | 28.0 | 2.6 | 26 | 70 | 5 | 5 | 1.1 |
| I | 15.0 | 9.0 | 5 | 700 | 9 | 5600 | 1.0 |
| J | 32.0 | 3.0 | 110 | 118 | 75 | 2 | 1.3 |

A vinylpyrrolidone/diethylaminomethyl methacrylate copolymer having a weight average molecular weight of 400,000 and a vinylpyrrolidone/diethylaminomethyl methacrylate copolymer having a weight average molecular weight of 1,800,000 were synthesized in the same manner as described above, except for appropriately adjusting the amount of component, the reaction temperature, and the reaction time.

4.2.3 Vinylpyrrolidone/Dimethylaminopropylacrylamide Copolymer

A flask equipped with a reflux condenser, a dropping funnel, a thermometer, a nitrogen replacement glass tube, and a stirrer was charged with water and 0.6 parts by mass of 2,2'-azobis(2-methylpropionamidine)dihydrochloride ("V-50" manufactured by Wako Pure Chemical Industries, Ltd.). The mixture was heated to 70° C. After the addition of 70 parts by mass of N-vinylpyrrolidone and 30 parts by mass of N,N-dimethylaminopropylacrylamide (DMAPAA), the mixture was polymerized at 75° C. for 5 hours under a nitrogen stream. After the addition of 0.2 parts by mass of 2,2'-azobis(2-methylpropionamidine)dihydrochloride ("V-50" manufactured by Wako Pure Chemical Industries, Ltd.), the mixture was refluxed at 70° C. for 6 hours under a nitrogen stream to obtain an aqueous dispersion containing 11 mass % of a vinylpyrrolidone/dimethylaminopropylacrylamide copolymer. The polymerization yield was 99%.

After the addition of diethyl sulfate (0.30 mol per mol of 2,2'-azobis(2-methylpropionamidine)dihydrochloride ("V-50" manufactured by Wako Pure Chemical Industries, Ltd.)), the mixture was refluxed at 50° C. for 10 hours under a nitrogen stream to cationize some of the amino groups.

The polyethylene glycol-reduced weight average molecular weight (Mw) of the copolymer determined by gel permeation chromatography (instrument: "HCL-8120" manufactured by Tosoh Corp., column: "TSK-GEL alpha-M", eluant: NaCl aqueous solution/acetonitrile) was 600,000. The amino group content and the cationic functional group content calculated from the amount of the monomers were 0.0010 mol/g and 0.0006 mol/g, respectively.

4.2.4 Vinylpyrrolidone/Vinyl Acetate Copolymer

A vinylpyrrolidone/vinyl acetate copolymer "PVP/VA copolymer W-735" (molecular weight: 32,000, vinylpyrrolidone:vinyl acetate=70:30) or "PVP/VA copolymer S-630" (molecular weight: 45,000, vinylpyrrolidone:vinyl acetate=60:40) (manufactured by ISP Japan, Ltd.) was used.

4.2.5 Polyethylene Glycol

Polyethylene glycol "PEG-1500" (molecular weight: 550) (manufactured by Sanyo Chemical Industries, Ltd.) was used.

4.2.6 Polyacrylic Acid 500 g of a 20 mass % acrylic acid aqueous solution was evenly added dropwise to a vessel (2 l) charged with 1000 g of ion-exchanged water and 1 g of a 5 mass % ammonium persulfate aqueous solution over 8 hours under reflux at 70° C. with stirring. After the addition, the mixture was allowed to stand for 2 hours under reflux to obtain an aqueous solution containing polyacrylic acid. The polyethylene glycol-reduced weight average molecular weight (Mw) of the polyacrylic acid determined by gel permeation chromatography (instrument: "HCL-8120" manufactured by Tosoh Corp., column: "TSK-GEL alpha-M", eluant: NaCl aqueous solution/acetonitrile) was 1,000,000.

Polyacrylic acid having a weight average molecular weight (Mw) of 200,000 was obtained in the same manner as described above, except for appropriately adjusting the amount of component, the reaction temperature, and the reaction time.

4.3 Preparation of Chemical Mechanical Polishing Aqueous Dispersion

A polyethylene bottle was charged with 50 parts by mass of ion-exchanged water and the silica particle dispersion A (amount of silica: 5 parts by mass). 1 part by mass of malonic acid, 0.2 parts by mass of quinaldic acid, 0.1 parts by mass of an acetylene diol nonionic surfactant ("Surfynol 465" manufactured by Air Products Japan, Inc.), and a polyacrylic acid aqueous solution (weight average molecular weight: 200,000) (amount of polymer: 0.05 parts by mass) were added to the mixture to obtain a chemical mechanical polishing aqueous dispersion. The pH of the chemical mechanical polishing aqueous dispersion was adjusted to 10.0 by adding a 10 mass % potassium hydroxide aqueous solution. After the addition of a 30 mass % hydrogen peroxide solution (amount of hydrogen peroxide: 0.05 parts by mass), the mixture was stirred for 15 minutes. After the addition of ion-exchanged water so that the total amount of the components was 100 parts by mass, the mixture was filtered through a filter having a pore size of 5 micrometers to obtain a chemical mechanical polishing aqueous dispersion S1 having a pH of 10.0.

The silica particles were collected from the chemical mechanical polishing aqueous dispersion S1 by centrifugation. The silica particles thus collected were dissolved in diluted hydrofluoric acid. The sodium content and the potassium content were measured by ICP-MS ("ELAN DRC PLUS" manufactured by PerkinElmer). The ammonium ion content was measured by ion chromatography ("ICS-1000" manufactured by DIONEX). The sodium content was 88 ppm, the potassium content was 5500 ppm, and the ammonium ion content was 5 ppm. It was thus confirmed that the contents of sodium, potassium, and ammonium ions included in the silica particles collected from the chemical mechanical polishing aqueous dispersion can be determined to obtain the same results as those of the silica particle dispersion.

Chemical mechanical polishing aqueous dispersions S2 to S45 were prepared in the same manner as the chemical mechanical polishing aqueous dispersion S1, except for changing the types and the amounts of the silica particle dispersion, the organic acid, the water-soluble polymer, and the additives as shown in Tables 3 to 8.

In Tables 3 to 8, Surfynol 465 and Surfynol 485 are 2,4,7,9-tetramethyl-5-decyne-4,7-diol-dipolyoxyethylene ethers manufactured by Air Products Japan, Inc. that differ in the number of moles of polyoxyethylene. Emulgen 104P and Emulgen 120 are polyoxyethylene lauryl ethers (alkyl ether-type nonionic surfactants) manufactured by Kao Corporation that differ in the number of moles of polyoxyethylene.

The resulting chemical mechanical polishing aqueous dispersion (S1 to S45) was allowed to stand at 25° C. for 6 months in a glass tube (100 cc). The presence or absence of precipitation was visually observed. The results are shown in Tables 3 to 8. In Tables 3 to 8, a case where precipitation of the particles and contrast were not observed was evaluated as "Good", a case where only contrast was observed was evaluated as "Fair", and a case where precipitation of the particles and contrast were observed was evaluated as "Bad".

4.4 Experimental Example 1

4.4.1 Unpatterned Substrate Polishing Evaluation

A porous polyurethane polishing pad ("IC1000" manufactured by Nitta Haas Inc.) was installed in a chemical mechanical polishing apparatus ("EPO112" manufactured by Ebara Corporation). A polishing rate measurement substrate was polished for 1 minute under the following polishing conditions while supplying one of the chemical mechanical polishing aqueous dispersions S1 to S17. The polishing rate and wafer contamination were evaluated by the following methods. The results are shown in Tables 3 and 4.

4.4.1a Measurement of Polishing Rate (1) Polishing Rate Measurement Substrate 8-inch silicon substrate with thermal oxide film on which a copper film having a thickness of 15,000 angstroms was stacked 8-inch silicon substrate with a thermal oxide film on which a tantalum film having a thickness of 2000 angstroms was stacked 8-inch silicon substrate on which a low-dielectric-constant insulating film ("Black Diamond" manufactured by Applied Materials) having a thickness of 10,000 angstroms was stacked 8-inch silicon substrate on which a PETEOS film having a thickness of 10,000 angstroms was stacked (2) Polishing Conditions Head rotational speed: 70 rpm Head load: 200 gf/cm$^2$ Table rotational speed: 70 rpm Dispersion supply rate: 200 ml/min The term "dispersion supply rate" refers to the total amount of the chemical mechanical polishing aqueous dispersion supplied per unit time.

(3) Calculation of Polishing Rate

The thickness of the copper film or the tantalum film was measured after polishing using an electric conduction-type thickness measurement system ("OmniMap RS75" manufactured by KLA-Tencor). The polishing rate was calculated from the reduction in thickness due to chemical mechanical polishing and the polishing time.

The thickness of the PETEOS film or the low-dielectric-constant insulating film was measured after polishing using an optical interference type thickness measurement device ("NanoSpec 6100" manufactured by Nanometrics Japan Ltd.). The polishing rate was calculated from the reduction in thickness due to chemical mechanical polishing and the polishing time.

4.4.1b Wafer Contamination

The PETEOS film or the low-dielectric-constant insulating film was polished in the same manner as in the section entitled "Measurement of polishing rate". When polishing the PETEOS film, the substrate was subjected to a vapor-phase decomposition treatment, and diluted hydrofluoric acid was dropped onto the surface of the substrate to dissolve the surface oxide film. The solution was subjected to ICP-MS analysis ("ELAN DRC PLUS" manufactured by PerkinElmer). When polishing the low-dielectric-constant insulating film, ultrapure water was dropped onto the surface of the substrate to extract a metal remaining on the surface of the low-dielectric-constant insulating film. The extract was subjected to ICP-MS analysis ("Agilent 7500s" manufactured by Yokogawa Analytical Systems., Inc.). It is preferable that the degree of wafer contamination be 3.0 atoms/cm$^2$ or less, and more preferably 2.5 atoms/cm$^2$ or less.

4.4.2 Patterned Wafer Polishing Evaluation

A porous polyurethane polishing pad ("IC1000" manufactured by Nitta Haas Inc.) was installed in a chemical mechanical polishing apparatus ("EPO112" manufactured by Ebara Corporation). A patterned wafer was polished under the following polishing conditions while supplying one of the chemical mechanical polishing aqueous dispersions S1 to S16. The flatness and the presence or absence of defects were evaluated by the following methods. The results are shown in Tables 3 and 4.

(1) Patterned Wafer

A silicon nitride film (1000 angstroms) was deposited on a silicon substrate. A low-dielectric-constant insulating film (Black Diamond film) (4500 angstroms) and a PETEOS film (500 angstroms) were sequentially deposited on the silicon nitride film. After SEMATECH854 mask pattern processing, a tantalum film (250 angstroms), a copper seed film (1000 angstroms), and a copper plating film (10,000 angstroms) were sequentially deposited to obtain a test substrate.

(2) Polishing Conditions of First Polishing Step

A chemical mechanical polishing aqueous dispersion used for the first polishing step was obtained by mixing CMS7401, CMS7452 (manufactured by JSR Corporation), ion-exchanged water, and a 4 mass % ammonium persulfate aqueous solution in a mass ratio of 1:1:2:4.

Head rotational speed: 70 rpm

Head load: 200 gf/cm$^2$

Table rotational speed: 70 rpm

Dispersion supply rate: 200 ml/min

The term "dispersion supply rate" refers to the total amount of the chemical mechanical polishing aqueous dispersion supplied per unit time.

Polishing time: 2.75 min (3) Polishing Conditions of Second Polishing Step

The chemical mechanical polishing aqueous dispersions S1 to S16 were used for the second polishing step.

Head rotational speed: 70 rpm

Head load: 200 gf/cm$^2$

Table rotational speed: 70 rpm

Dispersion supply rate: 200 ml/min

The term "dispersion supply rate" refers to the total amount of the chemical mechanical polishing aqueous dispersion supplied per unit time.

Polishing time: Polishing was terminated when 30 seconds elapsed after the PETEOS film had been removed from the polishing target surface ("patterned substrate polishing time" in Tables 3 and 4).

4.4.2a Flatness Evaluation

The amount of dishing (nm) of the copper interconnect of the polished surface of the patterned wafer subjected to the second polishing step was measured using a high-resolution profiler ("HRP240ETCH" manufactured by KLA-Tencor) (width of copper interconnect (line (L))/width of insulating film (space (S))=100 micrometers/100 micrometers). The amount of dishing is indicated by a negative value when the upper side of the copper interconnect was higher than a reference plane (i.e., the upper side of the insulating film). The amount of dishing is preferably −5 to 30 nm, and more preferably −2 to 20 nm.

The amount of erosion (nm) of the polished surface of the patterned wafer subjected to the second polishing step was measured in an area in which a minute interconnect had a length of 1000 micrometers (width of copper interconnect (line (L))/width of insulating film (space (S))=9 micrometers/1 micrometer). The amount of erosion is indicated by a negative value when the upper side of the copper interconnect was higher than a reference plane (i.e., the upper side of the insulating film). The amount of erosion is preferably −5 to 30 nm, and more preferably −2 to 20 nm.

4.4.2b Scratch Evaluation

The number of scratches of the polished surface of the patterned wafer subjected to the second polishing step was measured using a defect inspection system ("2351" manufactured by KLA-Tencor). In Tables 3 and 4, the number of scratches per wafer is indicated by a unit "/wafer". The number of scratches is preferably less than 100/wafer.

TABLE 3

|  |  | Example 1 | Example 2 | Example 3 | Example 4 |
|---|---|---|---|---|---|
| Chemical mechanical polishing aqueous dispersion | | S1 | S2 | S3 | S4 |
| Silica particles | Dispersion | A | B | C | D |
| | Content (mass %) | 5.0 | 2.5 | 7.5 | 1.5 |
| Organic acid | Type | Malonic acid | Maleic acid | Citric acid | Maleic acid |
| | Content (mass %) | 1.0 | 0.5 | 1.0 | 0.8 |
| | Type | Quinaldic acid | Quinaldic acid | Indolecarboxylic acid | Quinolinic acid |
| | Content (mass %) | 0.20 | 0.05 | 0.30 | 0.02 |
| Water-soluble polymer | Type | Polyacrylic acid | Polyacrylic acid | Polyacrylic acid | Polyvinyl pyrrolidone (K90) |
| | Weight average molecular weight | 200,000 | 1,000,000 | 200,000 | 1,200,000 |
| | Content (mass %) | 0.05 | 0.10 | 0.20 | 020 |
| Surfactant | Type | Surfynol 465 | Surfynol 465 | Emulgen 104P | Potassium dodecylbenzene-sulfonate |
| | Content (mass %) | 0.10 | 0.05 | 0.10 | 0.05 |
| Oxidizing agent | Type | Hydrogen peroxide | Hydrogen peroxide | Hydrogen peroxide | Hydrogen peroxide |
| | Content (mass %) | 0.05 | 0.10 | 0.30 | 0.20 |
| | pH | 10.0 | 9.5 | 10.5 | 10.0 |
| | Storage stability | Good | Good | Good | Good |
| Unpatterned substrate | Cu polishing rate (angstroms min) | 500 | 450 | 600 | 600 |
| | Ta RR polishing rate (angstroms min) | 850 | 650 | 900 | 500 |
| | BD polishing rate (angstroms min) | 100 | 130 | 90 | 300 |
| | PETEOS polishing rate (angstroms min) | 800 | 600 | 550 | 700 |
| | Cu Ta polishing rate ratio | 0.59 | 0.69 | 0.67 | 1.20 |
| | Cu PETEOS polishing rate ratio | 0.63 | 0.75 | 1.09 | 0.86 |
| | BD PETEOS polishing rate ratio | 0.13 | 0.22 | 0.16 | 0.43 |
| | Wafer contamination Black Diamond film (atoms cm$^2$) | 0.5 | 0.8 | 0.7 | 0.6 |
| | PETEOS film | 1.9 | 2.0 | 1.8 | 2.1 |
| Patterned wafer | Patterned wafer polishing time (sec) | 55 | 73 | 71 | 73 |
| | Flatness evaluation Amount of dishing (nm) LS = 100 100 micrometers | 8 | 15 | 12 | 20 |
| | Amount of erosion (nm) LS 9 1 micrometers | 5 | 10 | 10 | 18 |
| | Number of scratches (wafer) | 50 | 60 | 45 | 85 |

|  |  | Example 5 | Example 6 | Example 7 | Example 8 |
|---|---|---|---|---|---|
| Chemical mechanical polishing aqueous dispersion | | S5 | S6 | S7 | S8 |
| Silica particles | Dispersion | C | E | B | E |
| | Content (mass %) | 7.5 | 3.0 | 2.5 | 3.0 |
| Organic acid | Type | Citric acid | Maleic acid | Acetic acid | Maleic acid |
| | Content (mass %) | 1.0 | 1.0 | 0.5 | 1.0 |
| | Type | Indolecarboxylic acid | Quinaldic acid | Quinaldic acid | Quinaldic acid |
| | Content (mass %) | 0.30 | 0.05 | 0.05 | 0.05 |
| Water-soluble polymer | Type | Polyacrylic acid | Polyacrylic acid | Polyacrylic acid | — |
| | Weight average molecular weight | 200,000 | 1,000,000 | 1,000,000 | |
| | Content (mass %) | 0.20 | 0.10 | 0.10 | |
| Surfactant | Type | Surfynol 485 | Surfynol 465 | Surfynol 465 | Emulgen 104P |
| | Content (mass %) | 0.10 | 0.10 | 0.05 | 0.10 |
| Oxidizing agent | Type | Hydrogen peroxide | Hydrogen peroxide | Hydrogen peroxide | Hydrogen peroxide |
| | Content (mass %) | 0.30 | 0.10 | 0.10 | 0.10 |
| | pH | 10.5 | 9.5 | 9.5 | 8.5 |
| | Storage stability | Good | Good | Good | Good |
| Unpatterned substrate | Cu polishing rate (angstroms min) | 600 | 470 | 400 | 600 |
| | Ta RR polishing rate (angstroms min) | 900 | 750 | 200 | 700 |
| | BD polishing rate (angstroms min) | 90 | 110 | 50 | 100 |
| | PETEOS polishing rate (angstroms min) | 550 | 650 | 550 | 550 |
| | Cu Ta polishing rate ratio | 0.67 | 0.63 | 2.00 | 0.86 |
| | Cu PETEOS polishing rate ratio | 1.09 | 0.72 | 0.73 | 1.09 |
| | BD PETEOS polishing rate ratio | 0.16 | 0.17 | 0.09 | 0.18 |
| | Wafer contamination Black Diamond film (atoms cm$^2$) | 0.7 | 0.4 | 0.8 | 1.0 |
| | PETEOS film | 1.8 | 1.9 | 2.0 | 2.1 |
| Patterned wafer | Patterned wafer polishing time (sec) | 71 | 66 | 130 | 76 |
| | Flatness evaluation Amount of dishing (nm) LS = 100 100 micrometers | 12 | 10 | 14 | 50 |
| | Amount of erosion (nm) LS 9 1 micrometers | 10 | 8 | 12 | 30 |
| | Number of scratches (wafer) | 45 | 40 | 70 | 80 |

TABLE 4

|  |  | Comparative Example 1 | Comparative Example 2 | Comparative Example 3 | Comparative Example 4 |
|---|---|---|---|---|---|
| Chemical mechanical polishing aqueous dispersion | | S9 | S10 | S11 | S12 |
| Silica particles | Dispersion | F | G | H | I |
| | Content (mass %) | 7.5 | 5.0 | 5.0 | 7.5 |
| Organic acid | Type | Citric acid | Malonic acid | Malonic acid | Citric acid |
| | Content (mass %) | 1.0 | 1.0 | 1.0 | 1.0 |
| | Type | Indolecarboxylic acid | Quinaldic acid | Quinaldic acid | Indolecarboxylic acid |
| | Content (mass %) | 0.30 | 0.20 | 0.20 | 0.30 |
| Water-soluble polymer | Type | Polyacrylic acid | Polyacrylic acid | Polyacrylic acid | Polyacrylic acid |
| | Weight average molecular weight | 200,000 | 200,000 | 200,000 | 200,000 |
| | Content (mass %) | 0.20 | 0.05 | 0.10 | 0.05 |
| Surfactant | Type | Emulgen 104P | Surfuynol 465 | Surfynol 465 | Emulgen 120 |
| | Content (mass %) | 0.10 | 0.10 | 0.10 | 0.10 |
| Oxidizing agent | Type | Hydrogen peroxide | Hydrogen peroxide | Hydrogen peroxide | Hydrogen peroxide |
| | Content (mass %) | 0.30 | 0.05 | 0.10 | 0.30 |
| | pH | 10.5 | 10.0 | 10.0 | 10.5 |
| | Storage stability | Bad | Good | Fair | Good |
| Unpatterned substrate | Cu polishing rate (angstroms min) | 300 | 500 | 450 | 150 |
| | Ta RR polishing rate (angstroms min) | 600 | 850 | 800 | 600 |
| | BD polishing rate (angstroms min) | 80 | 100 | 80 | 40 |
| | PETEOS polishing rate (angstroms min) | 350 | 800 | 700 | 100 |
| | Cu Ta polishing rate ratio | 0.50 | 0.59 | 0.56 | 0.25 |
| | Cu PETEOS polishing rate ratio | 0.86 | 0.63 | 0.64 | 1.50 |
| | BD PETEOS polishing rate ratio | 0.23 | 0.13 | 0.11 | 0.40 |
| | Wafer contamination (atoms cm$^2$) Black Diamond film | 0.6 | 12.0 | 6.0 | 4.0 |
| | PETEOS film | 1.9 | 15.0 | 1.9 | 5.0 |
| Patterned wafer | Patterned wafer polishing time (sec) | 111 | 55 | 62 | 325 |
| | Flatness evaluation Amount of dishing (nm) LS = 100 100 micrometers | 3 | 10 | 8 | −10 |
| | Amount of erosion (nm) LS 9 1 micrometers | 2 | 7 | 6 | −5 |
| | Number of scratches (wafer) | 180 | 150 | 420 | 150 |

|  |  | Comparative Example 5 | Comparative Example 6 | Comparative Example 7 | Comparative Example 8 |
|---|---|---|---|---|---|
| Chemical mechanical polishing aqueous dispersion | | S13 | S14 | S15 | S16 |
| Silica particles | Dispersion | J | C | E | — |
| | Content (mass %) | 1.5 | 7.5 | 3.0 | |
| Organic acid | Type | Maleic acid | — | — | Maleic acid |
| | Content (mass %) | 0.8 | | | 0.5 |
| | Type | Quinolinic acid | — | — | Quinaldic acid |
| | Content (mass %) | 0.02 | | | 0.05 |
| Water-soluble polymer | Type | Polyvinyl pyrrolidone (K30) | Polyacrylic acid | — | Polyacrylic acid |
| | Weight average molecular weight | 400,000 | 200,000 | | 1,000,000 |
| | Content (mass %) | 0.20 | 0.20 | | 0.10 |
| Surfactant | Type | Potassium dodecylbenzene-sulfonate | Emulgen 104P | — | Surfynol 465 |
| | Content (mass %) | 0.05 | 0.10 | | 0.05 |
| Oxidizing agent | Type | Hydrogen peroxide | Hydrogen peroxide | Hydrogen peroxide | Hydrogen peroxide |
| | Content (mass %) | 0.20 | 0.30 | 0.10 | 0.10 |
| | pH | 10.0 | 10.5 | 8.5 | 9.5 |
| | Storage stability | Bad | Good | Good | Good |
| Unpatterned substrate | Cu polishing rate (angstroms min) | 800 | 400 | 400 | 50 |
| | Ta RR polishing rate (angstroms min) | 450 | 200 | 200 | 10 |
| | BD polishing rate (angstroms min) | 500 | 90 | 800 | 2 |
| | PETEOS polishing rate (angstroms min) | 900 | 550 | 550 | 5 |
| | Cu Ta polishing rate ratio | 1.78 | 2.00 | 2.00 | 5.00 |
| | Cu PETEOS polishing rate ratio | 0.89 | 0.73 | 0.73 | 10.00 |
| | BD PETEOS polishing rate ratio | 0.56 | 0.16 | 1.45 | 0.40 |
| | Wafer contamination (atoms cm$^2$) Black Diamond film | 0.5 | 0.7 | 1.0 | 0.8 |
| | PETEOS film | 2.0 | 0.8 | 2.1 | 2.0 |

TABLE 4-continued

| | | | | | |
|---|---|---|---|---|---|
| Patterned wafer | Patterned wafer polishing time (sec) | | 67 | 130 | 130 | 7500 |
| | Flatness evaluation | Amount of dishing (nm) LS = 100 100 micrometers | 25 | 12 | 32 | 15 |
| | | Amount of erosion (nm) LS 9 1 micrometers | 30 | 10 | 28 | 10 |
| | | Number of scratches (wafer) | 105 | 120 | 80 | 35 |

4.4.3 Evaluation Results of Experimental Example 1

As is clear from the results of the polishing test using the polishing rate measurement substrate, the polishing rate of the low-dielectric-constant insulating film was sufficiently reduced as compared with the polishing rate of the copper film, the tantalum film, or the PETEOS film when using the chemical mechanical polishing aqueous dispersions of Examples 1 to 8. As is clear from the results of the polishing test using the patterned wafer, the chemical mechanical polishing aqueous dispersions of Examples 1 to 8 produced a polished surface having excellent flatness, and reduced the number of scratches. The chemical mechanical polishing aqueous dispersions of Examples 1 to 8 showed excellent silica particle storage stability.

The chemical mechanical polishing aqueous dispersion S9 of Comparative Example 1 contained the silica particle dispersion F having a very low content of sodium, potassium, and ammonium ions. As a result, the silica particles exhibited poor storage stability. A large number of scratches of the copper film occurred in the polishing test using the patterned wafer.

The chemical mechanical polishing aqueous dispersion S10 of Comparative Example 2 contained the silica particle dispersion G having a very low content of potassium and ammonium ions. As a result, the silica particles exhibited poor storage stability. Since the silica particle dispersion G had a high sodium content (11,250 ppm), the wafer was contaminated (low-dielectric-constant insulating film and PETEOS film) in the polishing test using the polishing rate measurement substrate. A large number of scratches of the copper film occurred in the polishing test using the patterned wafer.

The chemical mechanical polishing aqueous dispersion S11 of Comparative Example 3 contained the silica particle dispersion H having a very low content of potassium and ammonium ions. As a result, the silica particles exhibited poor storage stability. A number (420/wafer) of scratches of the copper film occurred in the polishing test using the patterned wafer. Moreover, the state of the polished surface was inferior.

The chemical mechanical polishing aqueous dispersion S12 of Comparative Example 4 contained the silica particle dispersion I having a sodium content of 700 ppm. As a result, the wafer was contaminated in the polishing test using the polishing rate measurement substrate. A number (150/wafer) of scratches of the copper film occurred in the polishing test using the patterned wafer. Moreover, the state of the polished surface was inferior.

The chemical mechanical polishing aqueous dispersion S13 of Comparative Example 5 contained the silica particle dispersion J having a low content of potassium and ammonium ions. As a result, the silica particles exhibited poor storage stability. In the polishing test using the polishing rate measurement substrate, the polishing rate of the low-dielectric-constant insulating film could not be sufficiently reduced. A number (105/wafer) of scratches of the copper film occurred in the polishing test using the patterned wafer. Moreover, the state of the polished surface was inferior.

The chemical mechanical polishing aqueous dispersion S14 of Comparative Example 6 differs from the chemical mechanical polishing aqueous dispersion S3 of Example 3 in that the organic acid was not used. Excellent silica particle storage stability was obtained in Example 3 and Comparative Example 6. In Comparative Example 6, the polishing rate of the copper film significantly decreased (600→400 angstroms/min), and the polishing rate of the tantalum film also significantly decreased (900→200 angstroms/min) as compared with Example 3. Moreover, the number (45→120/wafer) of scratches of the copper film significantly increased as compared with Example 3.

The chemical mechanical polishing aqueous dispersion S15 of Comparative Example 7 did not contain the organic acid, the water-soluble polymer, and the surfactant. In the polishing test using the polishing rate measurement substrate, the polishing rate of the low-dielectric-constant insulating film could not be sufficiently reduced. Dishing occurred in the polishing test using the patterned wafer. Moreover, the state of the polished surface was inferior.

The chemical mechanical polishing aqueous dispersion S16 of Comparative Example 8 did not contain the silica particles. As a result, the polishing rate of each polishing target was very low in the polishing test using the polishing rate measurement substrate.

As described above, it was confirmed that the chemical mechanical polishing aqueous dispersions of Examples 1 to 8 can reduce the polishing rate of the low-dielectric-constant insulating film while achieving a high polishing rate of the copper film, the tantalum film, and the PETEOS film, and can achieve excellent flatness. It was also confirmed that the chemical mechanical polishing aqueous dispersions of Examples 1 to 8 can implement high-quality chemical mechanical polishing without causing defects of the metal film and the low-dielectric-constant insulating film, and can reduce contamination of the wafer due to a metal.

4.5 Experimental Example 2

4.5.1 Unpatterned Substrate Polishing Evaluation

A porous polyurethane polishing pad ("IC1000" manufactured by Nitta Haas Inc.) was installed in a chemical mechanical polishing apparatus ("EPO112" manufactured by Ebara Corporation). A polishing rate measurement substrate was polished for 1 minute under the following polishing conditions while supplying one of the chemical mechanical polishing aqueous dispersions S17 to S45. The polishing rate and wafer contamination were evaluated by the following methods. The results are shown in Tables 5 to 8.

4.5.1a Measurement of Polishing Rate (1) Polishing Rate Measurement Substrate 8-inch silicon substrate with thermal oxide film on which a copper film having a thickness of 15,000 angstroms was stacked 8-inch silicon substrate with a thermal oxide film on which a tantalum film having a thickness of 2000 angstroms was stacked (2) Polishing Conditions Head rotational speed: 70 rpm Head load: 200 gf/cm$^2$ Table rotational speed: 70 rpm
Dispersion supply rate: 200 ml/min The term "dispersion supply rate" refers to the total amount of the chemical mechanical polishing aqueous dispersion supplied per unit time.

(3) Calculation of Polishing Rate

The thickness of the copper film or the tantalum film was measured after polishing using an electric conduction-type thickness measurement system ("OmniMap RS75" manufactured by KLA-Tencor). The polishing rate was calculated from the reduction in thickness due to chemical mechanical polishing and the polishing time.

4.5.1b Wafer Contamination

The copper film was polished in the same manner as in the section entitled "Measurement of polishing rate". Ultrapure water was dropped onto the surface of the sample to extract a metal remaining on the surface of the copper film. The extract was subjected to ICP-MS analysis ("Agilent 7500s" manufactured by Yokogawa Analytical Systems, Inc.). It is preferable that the degree of wafer contamination be 3.0 atoms/cm$^2$ or less, and more preferably 2.5 atoms/cm$^2$ or less.

4.5.2 Patterned Wafer Polishing Evaluation

A porous polyurethane polishing pad ("IC1000" manufactured by Nitta Haas Inc.) was installed in a chemical mechanical polishing apparatus ("EPO112" manufactured by Ebara Corporation). A patterned wafer was polished in the same manner as in the section entitled "4.5.1a Measurement of polishing rate" while supplying one of the chemical mechanical polishing aqueous dispersions S17 to S45, except that polishing was terminated when the tantalum film was detected on the polishing target surface. The flatness and the presence or absence of defects were evaluated by the following methods. The results are shown in Tables 5 to 8.

(1) Patterned Wafer

A silicon nitride film (1000 angstroms) was deposited on a silicon substrate. A low-dielectric-constant insulating film (Black Diamond film) (4500 angstroms) and a PETEOS film (500 angstroms) were sequentially deposited on the silicon nitride film. After SEMATECH854 mask pattern processing, a tantalum film (250 angstroms), a copper seed film (1000 angstroms), and a copper plating film (10,000 angstroms) were sequentially deposited to obtain a test substrate.

4.5.2a Evaluation of Flatness

The amount of dishing (nm) of the copper interconnect of the polished surface of the patterned wafer subjected to the polishing step was measured using a high-resolution profiler ("HRP240ETCH" manufactured by KLA-Tencor) (width of copper interconnect (line (L))/width of insulating film (space (S))=100 micrometers/100 micrometers). The amount of dishing is indicated by a negative value when the upper side of the copper interconnect was higher than a reference plane (i.e., the upper side of the insulating film). The amount of dishing is preferably −5 to 30 nm, and more preferably −2 to 20 nm.

The amount of erosion (nm) of the polished surface of the patterned wafer subjected to the polishing step was measured in an area in which a minute interconnect had a length of 1000 micrometers (width of copper interconnect (line (L))/width of insulating film (space (S))=9 micrometers/1 micrometer). The amount of erosion is indicated by a negative value when the upper side of the copper interconnect was higher than a reference plane (i.e., the upper side of the insulating film). The amount of erosion is preferably −5 to 30 nm, and more preferably −2 to 20 nm.

4.5.2b Evaluation of Corrosion

The number of defects having a size of 10 to 100 nm$^2$ in the copper area (1×1 cm) of the polished surface of the patterned wafer subjected to the polishing step was evaluated using a defect inspection system ("2351" manufactured by KLA-Tencor). In Tables 5 to 8, a case where the number of defects (corrosion) was 0 to 10 was indicated by "Good". A case where the number of defects was 11 to 100 was indicated by "Fair". A case where the number of defects was 101 or more was indicated by "Bad".

4.5.2c Evaluation of Copper Residue on Fine Interconnect Pattern

The presence or absence of Cu residue (copper residue) in an isolated interconnect area (width: 0.18 micrometers) in an area in which a pattern (an interconnect area (width: 0.18 micrometers, length: 1.6 mm) and an insulating area (width: 0.18 1 micrometers, length: 1.6 mm) were alternately provided) was formed to a length of 1.25 mm in the direction perpendicular to the longitudinal direction was evaluated using an ultra high-resolution field emission scanning electron microscope ("S-4800" manufactured by Hitachi High-Technologies Corporation). The evaluation results are shown in Tables 5 to 8. In Tables 5 to 8, the evaluation item "Cu residue" indicates a Cu residue on the pattern. A case where a Cu residue was not observed was indicated by "Good". A case where a Cu residue was observed on part of the pattern was indicated by "Fair". A case where a Cu residue was observed over the entire pattern was indicated by "Bad".

TABLE 5

| | | Example 9 | Example 10 | Example 11 | Example 12 |
|---|---|---|---|---|---|
| Chemical mechanical polishing aqueous dispersion | | S17 | S18 | S19 | S20 |
| Silica particles | Dispersion | A | A | B | B |
| | Content (mass %) | 0.5 | 0.5 | 0.8 | 0.25 |
| Amino acid | Type | Alanine | Alanine | Glycine | Glycine |
| Other organic acids | Content (mass %) | 1.2 | 1.2 | 0.5 | 0.3 |
| | Type | | Quinaldic acid | Histidine | Glycylglycine |
| | Content (mass %) | | 0.2 | 0.3 | 0.5 |
| | Type | | | Quinaldic acid | |
| | Content (mass %) | | | 0.3 | |
| Water-soluble polymer | Type | Polyvinyl pyrrolidone (K30) | Polyvinyl pyrrolidone (K30) | Polyvinyl pyrrolidone (K30) | Vinylpyrrolidone dimethylaminopropylacrylamide copolymer |
| | Weight average molecular weight | 40,000 | 40,000 | 40,000 | 600,000 |
| | Content (mass %) | 0.05 | 0.05 | 0.03 | 0.03 |
| Surfactant | Type | Surfynol 485 | Surfynol 485 | Emulgen 104P | Ammonium dodecylbenzene sulfonate |
| | Content (mass %) | 0.03 | 0.01 | 0.05 | 0.08 |

TABLE 5-continued

|  |  | | | | |
|---|---|---|---|---|---|
| Oxidizing agent | Type | Ammonium persulfate | Hydrogen peroxide | Hydrogen peroxide | Ammonium persulfate |
|  | Content (mass %) | 1.5 | 0.2 | 0.2 | 2.5 |
| Other additives | Type |  |  |  | Ethylene glycol |
|  | Content (mass %) |  |  |  | 0.01 |
|  | pH | 9.3 | 9.4 | 9.5 | 8.6 |
|  | Storage stability | Good | Good | Good | Good |
| Unpatterned substrate | Cu polishing rate (angstroms min) | 10.000 | 9.000 | 8.000 | 8.500 |
|  | Ta polishing rate (angstroms min) | 2 | 1 | 1 | 1 |
|  | Wafer contamination (atoms cm²) | 0.5 | 0.4 | 0.8 | 0.8 |
| Patterned wafer | Flatness evaluation | Amount of dishing (nm) LS = 100 100 micrometers | 20 | 20 | 25 | 15 |
|  |  | Amount of erosion (nm) LS 9 1 micrometers | 10 | 5 | 5 | 10 |
|  | Corrosion | Good | Good | Good | Good |
|  | Copper residue | Good | Good | Good | Good |

|  |  | Example 13 | Example 14 | Example 15 | Example 16 |
|---|---|---|---|---|---|
| Chemical mechanical polishing aqueous dispersion |  | S21 | S22 | S23 | S24 |
| Silica particles | Dispersion | E | D | E | C |
|  | Content (mass %) | 0.5 | 0.75 | 0.5 | 1.0 |
| Amino acid | Type | Glycine | Alanine | Glycine | Glycine |
|  | Content (mass %) | 1.0 | 0.8 | 1.0 | 1.5 |
| Other organic acids | Type | Alanine | Malic acid | Alanine |  |
|  | Content (mass %) | 0.2 | 0.01 | 0.2 |  |
|  | Type |  | Quinolinic acid |  |  |
|  | Content (mass %) |  | 0.02 |  |  |
| Water-soluble polymer | Type | Vinylpyrrolidone diethylaminomethyl methacrylate copolymer | Polyvinyl pyrrolidone (K90) | — | Polyvinyl pyrrolidone (K60) |
|  | Weight average molecular weight | 400,000 | 1,200,000 |  | 700,000 |
|  | Content (mass %) | 0.05 | 0.02 |  | 0.10 |
| Surfactant | Type | — | Potassium dodecylbenzene sulfonate | — | Emulgen 104P |
|  | Content (mass %) |  | 0.05 |  | 0.10 |
| Oxidizing agent | Type | Hydrogen peroxide | Hydrogen peroxide | Hydrogen peroxide | Hydrogen peroxide |
|  | Content (mass %) | 0.1 | 0.2 | 0.1 | 0.3 |
| Other additives | Type | Benzimidazole |  | Benzimidazole | Benzotriazole |
|  | Content (mass %) | 0.05 |  | 0.05 | 0.01 |
|  | pH | 9.0 | 10.0 | 9.0 | 8.7 |
|  | Storage stability | Good | Good | Good | Good |
| Unpatterned substrate | Cu polishing rate (angstroms min) | 9.500 | 12.000 | 10.000 | 8.000 |
|  | Ta polishing rate (angstroms min) | 1 | 1 | 3 | 1 |
|  | Wafer contamination (atoms cm²) | 1.0 | 0.6 | 1.0 | 0.7 |
| Patterned wafer | Flatness evaluation | Amount of dishing (nm) LS = 100 100 micrometers | 10 | 20 | 30 | 12 |
|  |  | Amount of erosion (nm) LS 9 1 micrometers | −1 | 18 | 20 | 8 |
|  | Corrosion | Good | Good | Good | Good |
|  | Copper residue | Good | Good | Good | Good |

TABLE 6

|  |  | Example 17 | Example 18 | Example 19 | Example 20 |
|---|---|---|---|---|---|
| Chemical mechanical polishing aqueous dispersion |  | S25 | S26 | S27 | S28 |
| Silica particles | Dispersion | C | C | A | B |
|  | Content (mass %) | 0.8 | 0.8 | 0.5 | 0.8 |
| Amino acid | Type | Histidine | Glycine | Alanine | Glycine |

TABLE 6-continued

|  |  |  |  |  |  |
|---|---|---|---|---|---|
| Other organic acids | Content (mass %) | 0.3 | 1.7 | 1.2 | 0.5 |
|  | Type | Oxalic acid | Phenylalanine |  | Histidine |
|  | Content (mass %) | 0.3 | 0.1 |  | 0.3 |
|  | Type | Quinolinic acid |  |  | Quinaldic acid |
|  | Content (mass %) | 0.20 |  |  | 0.3 |
| Water-soluble polymer | Type | Polyvinyl pyrrolidone (K60) | Vinylpyrrolidone vinyl acetate copolymer | Polyvinyl pyrrolidone (K30) | Polyvinyl pyrrolidone (K30) |
|  | Weight average molecular weight | 700,000 | 32,000 | 40,000 | 40,000 |
|  | Content (mass %) | 0.10 | 0.03 | 0.05 | 0.03 |
| Surfactant | Type | Emulgen 104P | Emulgen 104P | Dipotassium alkenyl succinate | Dipotassium alkenyl succinate |
|  | Content (mass %) | 0.10 | 0.10 | 0.03 | 0.0005 |
|  | Type |  |  |  |  |
|  | Content (mass %) |  |  |  |  |
| Oxidizing agent | Type | Ammonium persulfate | Ammonium persulfate | Ammonium persulfate | Hydrogen peroxide |
|  | Content (mass %) | 1.5 | 1.5 | 1.5 | 0.2 |
| Other additives | Type |  | 1H-1.2.4-triazole |  |  |
|  | Content (mass %) |  | 0.01 |  |  |
|  | pH | 8.5 | 9.0 | 9.3 | 9.5 |
|  | Storage stability | Good | Good | Good | Good |
| Unpatterned substrate | Cu polishing rate (angstroms min) | 9.000 | 9.000 | 9.000 | 10.500 |
|  | Ta polishing rate (angstroms min) | 2 | 1 | 1 | 2 |
|  | Wafer contamination (atoms $cm^2$) | 0.7 | 0.7 | 0.6 | 0.7 |
| Patterned wafer | Flatness evaluation — Amount of dishing (nm) LS 100 100 micrometers | 12 | 12 | 18 | 22 |
|  | Amount of erosion (nm) LS = 9 1 micrometers | 10 | 10 | 12 | 10 |
|  | Corrosion | Good | Good | Good | Good |
|  | Copper residue | Good | Good | Good | Good |

|  |  | Example 21 | Example 22 | Example 23 | Example 24 |
|---|---|---|---|---|---|
| Chemical mechanical polishing aqueous dispersion |  | S29 | S30 | S31 | S32 |
| Silica particles | Dispersion | C | D | B | D |
|  | Content (mass %) | 1.0 | 1.0 | 0.3 | 0.3 |
| Amino acid | Type | Glycine | Alanine | Glycine | Glycine |
| Other organic acids | Content (mass %) | 1.5 | 0.8 | 0.3 | 1.0 |
|  | Type |  | Malic acid | Glycylglycine | Phenylalanine |
|  | Content (mass %) |  | 0.01 | 0.5 | 0.1 |
|  | Type |  | Quinolinic acid |  |  |
|  | Content (mass %) |  | 0.02 |  |  |
| Water-soluble polymer | Type | Polyvinyl pyrrolidone (K60) | Polyvinyl pyrrolidone (K30) | — | Polyvinyl pyrrolidone (K90) |
|  | Weight average molecular weight | 700,000 | 40,000 |  | 700,000 |
|  | Content (mass %) | 0.10 | 0.10 |  | 0.03 |
| Surfactant | Type | Potassium naphthalene sulfonate | Potassium dodecylbenzene sulfonate | Ammonium dodecylbenzene sulfonate | Ammonium dodecylbenzene sulfonate |
|  | Content (mass %) | 0.10 | 0.05 | 0.04 | 0.05 |
|  | Type |  |  |  | Dipotassium alkenyl succinate |
|  | Content (mass %) |  |  |  | 0.002 |
| Oxidizing agent | Type | Hydrogen peroxide | Ammonium persulfate | Ammonium persulfate | Ammonium persulfate |
|  | Content (mass %) | 0.3 | 2.0 | 2.5 | 2.5 |
| Other additives | Type | Benzotriazole |  | Ethylene glycol |  |
|  | Content (mass %) | 0.01 |  | 0.01 |  |
|  | pH | 8.7 | 9.0 | 8.6 | 9.1 |
|  | Storage stability | Good | Good | Good | Good |
| Unpatterned substrate | Cu polishing rate (angstroms min) | 11.000 | 10.300 | 8.500 | 11.500 |
|  | Ta polishing rate (angstroms min) | 1 | 3 | 1 | 1 |
|  | Wafer contamination (atoms $cm^2$) | 0.4 | 0.5 | 0.8 | 0.4 |

TABLE 6-continued

| Patterned wafer | Flatness evaluation | Amount of dishing (nm) LS 100 100 micrometers | 15 | 20 | 15 | 15 |
|---|---|---|---|---|---|---|
| | | Amount of erosion (nm) LS = 9 1 micrometers | 10 | 8 | 10 | 5 |
| | | Corrosion | Good | Good | Good | Good |
| | | Copper residue | Good | Good | Good | Good |

TABLE 7

| | | Comparative Example 9 | Comparative Example 10 | Comparative Example 11 | Comparative Example 12 |
|---|---|---|---|---|---|
| Chemical mechanical polishing aqueous dispersion | | S33 | S34 | S35 | S36 |
| Silica particles | Dispersion | A | A | G | H |
| | Content (mass %) | 0.5 | 0.5 | 0.5 | 0.8 |
| Amino acid | Type | — | Maleic acid | Alanine | Glycine |
| Other organic acids | Content (mass %) | | 0.3 | 1.2 | 0.5 |
| | Type | | | | Histidine |
| | Content (mass %) | | | | 0.3 |
| | Type | | | | Quinaldic acid |
| | Content (mass %) | | | | 0.3 |
| Water-soluble polymer | Type | Polyvinyl pyrrolidone (K30) | Polyvinyl pyrrolidone (K30) | — | — |
| | Weight average molecular weight | 40,000 | 40,000 | | |
| | Content (mass %) | 0.05 | 0.05 | | |
| Surfactant | Type | Surfynol 485 | Surfynol 485 | Surfynol 485 | Emulgen 104P |
| | Content (mass %) | 0.03 | 0.03 | 0.03 | 0.05 |
| Oxidizing agent | Type | Ammonium persulfate | Ammonium persulfate | Ammonium persulfate | Hydrogen peroxide |
| | Content (mass %) | 1.5 | 1.5 | 1.5 | 0.5 |
| Other additives | Type | | | | |
| | Content (mass %) | | | | |
| | pH | 9.3 | 9.3 | 9.3 | 9.5 |
| | Storage stability | Good | Good | Good | Fair |
| Unpatterned substrate | Cu polishing rate (angstroms min) | 1.000 | 2.000 | 12.000 | 8.000 |
| | Ta polishing rate (angstroms min) | 2 | 10 | 20 | 12 |
| | Wafer contamination (atoms $cm^2$) | 1.0 | 1.0 | 12.0 | 0.6 |
| Patterned wafer | Flatness evaluation | Amount of dishing (nm) LS 100 100 micrometers | 10 | 10 | 60 | 40 |
| | | Amount of erosion (nm) LS 9 1 micrometers | 5 | 10 | 40 | 35 |
| | | Corrosion | Good | Good | Good | Good |
| | | Copper residue | Bad | Bad | Good | Good |

| | | Comparative Example 13 | Comparative Example 14 | Comparative Example 15 |
|---|---|---|---|---|
| Chemical mechanical polishing aqueous dispersion | | S37 | S38 | S39 |
| Silica particles | Dispersion | J | H | F |
| | Content (mass %) | 1.0 | 0.8 | 0.5 |
| Amino acid | Type | Glycine | Glycine | Oxalic acid |
| Other organic acids | Content (mass %) | 1.5 | 0.5 | 0.3 |
| | Type | | Histidine | Picolinic acid |
| | Content (mass %) | | 0.3 | 0.3 |
| | Type | | Quinaldic acid | Quinolinic acid |
| | Content (mass %) | | 0.3 | 0.1 |
| Water-soluble polymer | Type | Vinylpyrrolidone vinyl acetate copolymer | Polyethylene glycol | — |
| | Weight average molecular weight | 45,000 | 550 | |
| | Content (mass %) | 0.05 | 0.03 | |
| Surfactant | Type | Emulgen 104P | Emulgen 104P | Potassium dodecylbenzene sulfonate |
| | Content (mass %) | 0.10 | 0.05 | 0.02 |
| Oxidizing agent | Type | Hydrogen peroxide | Hydrogen peroxide | Ammonium persulfate |
| | Content (mass %) | 0.3 | 0.5 | 1.5 |
| Other additives | Type | Benzotriazole | | |
| | Content (mass %) | 0.01 | | |

TABLE 7-continued

|  |  |  | | | |
|---|---|---|---|---|---|
|  |  | pH | 8.7 | 9.5 | 8.5 |
|  |  | Storage stability | Bad | Fair | Good |
| Unpatterned substrate |  | Cu polishing rate (angstroms min) | 7.000 | 8.000 | 8.500 |
|  |  | Ta polishing rate (angstroms min) | 2 | 12 | 20 |
|  |  | Wafer contamination (atoms $cm^2$) | 0.5 | 0.6 | 0.7 |
| Patterned wafer | Flatness evaluation | Amount of dishing (nm) LS 100 100 micrometers | 12 | 40 | 40 |
|  |  | Amount of erosion (nm) LS 9 1 micrometers | 8 | 35 | 30 |
|  |  | Corrosion | Good | Good | Bad |
|  |  | Copper residue | Fair | Good | Good |

TABLE 8

|  |  | Comparative Example 16 | Comparative Example 17 | Comparative Example 18 |
|---|---|---|---|---|
| Chemical mechanical polishing aqueous dispersion |  | S40 | S41 | S42 |
| Silica particles | Dispersion | C | — | G |
|  | Content (mass %) | 0.6 |  | 0.5 |
| Amino acid | Type | — | Maleic acid | Alanine |
| Other organic acids | Content (mass %) |  | 0.5 | 1.2 |
|  | Type |  | Quinaldic acid |  |
|  | Content (mass %) |  | 0.05 |  |
|  | Type |  |  |  |
|  | Content (mass %) |  |  |  |
| Water-soluble polymer | Type | Polyvinylpyrrolidone (K60) | Polyacrylic acid | Polyvinylpyrrolidone (K30) |
|  | Weight average molecular weight | 700,000 | 1,000,000 | 40,000 |
|  | Content (mass %) | 0.10 | 0.10 | 0.05 |
| Surfactant | Type | — | Surfynol 485 | — |
|  | Content (mass %) |  | 0.05 |  |
| Oxidizing agent | Type | Hydrogen peroxide | Hydrogen peroxide | Ammonium persulfate |
|  | Content (mass %) | 0.2 | 0.1 | 1.5 |
|  | pH | 9.0 | 9.5 | 9.3 |
|  | Storage stability | Good | Good | Good |
| Unpatterned substrate | Cu polishing rate (angstroms min) | 300 | 50 | 12.000 |
|  | Ta polishing rate (angstroms min) | 2 | 10 | 20 |
|  | Wafer contamination (atoms $cm^2$) | 0.6 | 0.4 | 12.0 |
| Patterned wafer | Flatness evaluation | Amount of dishing (nm) LS 100 100 micrometers | 60 | 15 | 60 |
|  |  | Amount of erosion (nm) LS 9 1 micrometers | 10 | 10 | 40 |
|  |  | Corrosion | Bad | Good | Good |
|  |  | Copper residue | Good | Fair | Good |

|  |  | Comparative Example 19 | Comparative Example 20 | Comparative Example 21 |
|---|---|---|---|---|
| Chemical mechanical polishing aqueous dispersion |  | S43 | S44 | S45 |
| Silica particles | Dispersion | I | A | — |
|  | Content (mass %) | 1.0 | 0.5 |  |
| Amino acid | Type | Alanine | — | Alanine |
| Other organic acids | Content (mass %) | 0.8 |  | 1.2 |
|  | Type | Malic acid |  |  |
|  | Content (mass %) | 0.01 |  |  |
|  | Type | Quinolinic acid |  |  |
|  | Content (mass %) | 0.02 |  |  |
| Water-soluble polymer | Type | Polyvinylpyrrolidone (K30) | Polyvinylpyrrolidone (K30) | Polyvinylpyrrolidone (K30) |
|  | Weight average molecular weight | 40,000 | 40,000 | 40,000 |
|  | Content (mass %) | 0.10 | 0.03 | 0.03 |
| Surfactant | Type | — | Dipotassium alkenylsuccinate | Dipotassium alkenylsuccinate |
|  | Content (mass %) |  | 0.03 | 0.03 |
| Oxidizing agent | Type | Ammonium persulfate | Ammonium persulfate | Ammonium persulfate |
|  | Content (mass %) | 2.0 | 1.5 | 1.5 |

TABLE 8-continued

| | | pH | 8.0 | 9.3 | 9.3 |
|---|---|---|---|---|---|
| | | Storage stability | Good | Good | Good |
| Unpatterned substrate | | Cu polishing rate (angstroms min) | 6.000 | 200 | 420 |
| | | Ta polishing rate (angstroms min) | 1 | 2 | 1 |
| | | Wafer contamination (atoms $cm^2$) | 0.6 | 0.7 | 0.2 |
| Patterned wafer | Flatness evaluation | Amount of dishing (nm) LS 100 100 micrometers | 20 | −30 | −50 |
| | | Amount of erosion (nm) LS 9 1 micrometers | −10 | −30 | −60 |
| | | Corrosion | Good | Good | Good |
| | | Copper residue | Bad | Bad | Bad |

4.5.3 Evaluation Results of Experimental Example 2

As is clear from the results of the polishing test using the polishing rate measurement substrate, the polishing rate of the copper film was 8000 angstroms/min or more, and the polishing rate of the barrier metal film was 1 to 3 angstroms/min when using the chemical mechanical polishing aqueous dispersions of Examples 9 to 24. Specifically, the chemical mechanical polishing aqueous dispersions of Examples 9 to 24 showed excellent copper film polishing selectivity. Moreover, no or only a small degree of wafer contamination was observed. As is clear from the results of the polishing test using the patterned wafer, the chemical mechanical polishing aqueous dispersions of Examples 9 to 24 produced a polished surface having excellent flatness, and did not cause corrosion or a copper residue. The chemical mechanical polishing aqueous dispersions of Examples 9 to 24 showed excellent silica particle storage stability.

The chemical mechanical polishing aqueous dispersion S33 of Comparative Example 9 did not contain the amino acid. As a result, the polishing rate of the copper film decreased to 1000 angstroms/min in the polishing test using the polishing rate measurement substrate.

The chemical mechanical polishing aqueous dispersion S34 of Comparative Example 10 contained maleic acid instead of the amino acid. As a result, the polishing rate of the copper film decreased to 2000 angstroms/min in the polishing test using the polishing rate measurement substrate.

The chemical mechanical polishing aqueous dispersion S35 of Comparative Example 11 contained the silica particle dispersion G having a high sodium content (11,250 ppm). As a result, the wafer was contaminated in the polishing test using the polishing rate measurement substrate. Moreover, the polishing rate of the tantalum film increased to 20 angstroms/min (i.e., copper film polishing selectivity was poor). Dishing and erosion occurred in the polishing test using the patterned wafer.

The chemical mechanical polishing aqueous dispersion S36 of Comparative Example 12 contained the silica particle dispersion H having a low content of potassium and ammonium ions. As a result, the silica particles exhibited poor storage stability. In the polishing test using the polishing rate measurement substrate, the polishing rate of the tantalum film increased to 12 angstroms/min (i.e., copper film polishing selectivity was poor). Dishing and erosion occurred in the polishing test using the patterned wafer.

The chemical mechanical polishing aqueous dispersion S37 of Comparative Example 13 contained the silica particle dispersion J having a low content of potassium and ammonium ions. As a result, the silica particles exhibited poor storage stability.

The chemical mechanical polishing aqueous dispersion S38 of Comparative Example 14 contained the silica particle dispersion H having a low content of potassium and ammonium ions. As a result, the silica particles exhibited poor storage stability. In the polishing test using the polishing rate measurement substrate, the polishing rate of the tantalum film increased to 12 angstroms/min (i.e., copper film polishing selectivity was poor). Dishing and erosion occurred in the polishing test using the patterned wafer.

The chemical mechanical polishing aqueous dispersion S39 of Comparative Example 15 did not contain the amino acid. As a result, the polishing rate of the tantalum film increased to 20 angstroms/min (i.e., copper film polishing selectivity was poor) in the polishing test using the polishing rate measurement substrate. Moreover, dishing and erosion occurred in the polishing test using the patterned wafer.

The chemical mechanical polishing aqueous dispersion S40 of Comparative Example 16 did not contain the amino acid. As a result, the polishing rate of the copper film significantly decreased in the polishing test using the polishing rate measurement substrate. Moreover, dishing and erosion of the copper film occurred in the polishing test using the patterned wafer.

The chemical mechanical polishing aqueous dispersion S41 of Comparative Example 17 did not contain the silica particles. As a result, the polishing rate of the copper film significantly decreased in the polishing test using the polishing rate measurement substrate.

The chemical mechanical polishing aqueous dispersion S42 of Comparative Example 18 contained the silica particle dispersion G having a high sodium content (11,250 ppm). As a result, the wafer was contaminated in the polishing test using the polishing rate measurement substrate. Moreover, the polishing rate of the tantalum membrane increased to 20 angstroms/min (i.e., copper film polishing selectivity was poor). Dishing and erosion occurred in the polishing test using the patterned wafer.

The chemical mechanical polishing aqueous dispersion S43 of Comparative Example 19 contained the silica particle dispersion I having a sodium content of 700 ppm. As a result, the polishing rate of the copper film decreased to 6000 angstroms/min in the polishing test using the polishing rate measurement substrate. A copper residue was observed in the polishing test using the patterned wafer.

The chemical mechanical polishing aqueous dispersion S44 of Comparative Example 20 differs from the chemical mechanical polishing aqueous dispersion S28 of Example 19 in that the amino acid was not used. In the polishing test using the polishing rate measurement substrate, the polishing rate of the copper film significantly decreased (9000→200 angstroms/min) in Comparative Example 20 as compared with Example 19. A copper residue was observed in the polishing test using the patterned wafer.

The chemical mechanical polishing aqueous dispersion S45 of Comparative Example 21 did not contain the silica particles. As a result, the polishing rate of the copper film significantly decreased.

As described above, the chemical mechanical polishing aqueous dispersions of Examples 9 to 24 achieved a high polishing rate of the copper film while achieving high polishing selectivity. Moreover, the chemical mechanical polishing aqueous dispersions of Examples 9 to 24 implemented high-quality chemical mechanical polishing under normal pressure conditions without causing defects of the metal film and the low-dielectric-constant insulating film, and suppressed contamination of the wafer due to a metal.

The invention claimed is:

1. A chemical mechanical polishing aqueous dispersion comprising silica particles (A), and an organic acid (B1),
    wherein sodium content, potassium content, and ammonium ion content of the silica particles (A), as determined by ICP atomic emission spectrometry, ICP mass spectrometry, or ammonium ion quantitative analysis with ion chromatography, have a relationship in which the sodium content is 5 to 500 ppm and at least one of the potassium content and the ammonium ion content is 100 to 20,000 ppm.

2. The chemical mechanical polishing aqueous dispersion according to claim 1, wherein the organic acid (B1) is an organic acid comprising two or more carboxyl groups.

3. The chemical mechanical polishing aqueous dispersion according to claim 2, wherein the organic acid comprising two or more carboxyl groups has an acid dissociation constant (pKa) at 25° C. of 5.0 or more, the acid dissociation constant (pKa) being an acid dissociation constant (pKa) of a second carboxyl group when the organic acid has two carboxyl groups, and an acid dissociation constant (pKa) of a third carboxyl group when the organic acid comprises three or more carboxyl groups.

4. The chemical mechanical polishing aqueous dispersion according to claim 2, wherein the organic acid comprising two or more carboxyl groups is at least one organic acid selected from the group consisting of maleic acid, malonic acid, and citric acid.

5. The chemical mechanical polishing aqueous dispersion according to claim 1, further comprising a nonionic surfactant (C1).

6. The chemical mechanical polishing aqueous dispersion according to claim 5, wherein the nonionic surfactant (C1) includes at least one acetylene group.

7. The chemical mechanical polishing aqueous dispersion according to claim 5, wherein the nonionic surfactant (C1) is a compound represented by formula (1):

wherein m and n are independently integers equal to or larger than one, provided that m+n≦50.

8. The chemical mechanical polishing aqueous dispersion according to claim 1, further comprising a water-soluble polymer (D1) having a weight average molecular weight of 50,000 to 5,000,000.

9. The chemical mechanical polishing aqueous dispersion according to claim 8, wherein the water-soluble polymer (D1) is a polycarboxylic acid.

10. The chemical mechanical polishing aqueous dispersion according to claim 9, wherein the polycarboxylic acid is poly(meth)acrylic acid.

11. The chemical mechanical polishing aqueous dispersion according to claim 8, wherein a content of the water-soluble polymer (D1) is 0.001 to 1.0 mass % based on a total mass of the chemical mechanical polishing aqueous dispersion.

12. The chemical mechanical polishing aqueous dispersion according to claim 1, wherein the silica particles (A) have a ratio, Rmax/Rmin, of a major axis, Rmax, to a minor axis, Rmin, of 1.0 to 1.5.

13. The chemical mechanical polishing aqueous dispersion according to claim 1, wherein the silica particles (A) have an average particle diameter calculated from a specific surface area determined by a BET method of 10 to 100 nm.

14. The chemical mechanical polishing aqueous dispersion according to claim 1 having a pH of 6 to 12.

15. A chemical mechanical polishing aqueous dispersion comprising silica particles (A), and an amino acid (B2),
    wherein sodium content, potassium content, and ammonium ion content of the silica particles (A), as determined by ICP atomic emission spectrometry, ICP mass spectrometry, or ammonium ion quantitative analysis with ion chromatography, have a relationship in which the sodium content is 5 to 500 ppm and at least one of the potassium content and the ammonium ion content is 100 to 20,000 ppm.

16. The chemical mechanical polishing aqueous dispersion according to claim 15, wherein the amino acid (B2) is at least one amino acid selected from the group consisting of glycine, alanine, and histidine.

17. The chemical mechanical polishing aqueous dispersion according to claim 15, further comprising an organic acid that comprises a nitrogen-containing heterocyclic ring and a carboxyl group.

18. The chemical mechanical polishing aqueous dispersion according to claim 15, further comprising an anionic surfactant (C2).

19. The chemical mechanical polishing aqueous dispersion according to claim 18, wherein the anionic surfactant (C2) includes at least one functional group selected from the group consisting of a carboxyl group, a sulfonic acid group, a phosphoric acid group, an ammonium salt of a carboxyl group, an ammonium salt of a sulfonic acid group, an ammonium salt of a phosphoric acid group, a metal salt of a carboxyl group, a metal salt of a sulfonic acid group, and a metal salt of a phosphoric acid group.

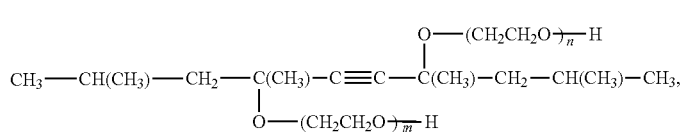

(1)

20. The chemical mechanical polishing aqueous dispersion according to claim 18, wherein the anionic surfactant (C2) is at least one selected from the group consisting of an alkyl sulfate, an alkyl ether sulfate salt, an alkyl ether carboxylate, an alkylbenzenesulfonate, an alpha-sulfofatty acid ester salt, an alkyl polyoxyethylene sulfate, an alkyl phosphate, a monoalkyl phosphate salt, a naphthalenesulfonate, an alpha-olefin sulfonate, an alkanesulfonate, and an alkenylsuccinate.

21. The chemical mechanical polishing aqueous dispersion according to claim 18, wherein the anionic surfactant (C2) is a compound represented by formula (2):

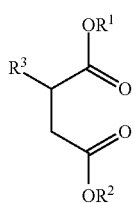

(2)

wherein $R^1$ and $R^2$ independently represent a hydrogen atom, a metal atom, or a substituted or unsubstituted alkyl group, and $R^3$ represents a substituted or unsubstituted alkenyl group or a sulfonic acid group, —$SO_3X$, wherein X represents a hydrogen ion, an ammonium ion, or a metal ion.

22. The chemical mechanical polishing aqueous dispersion according to claim 15, further comprising a water-soluble polymer (D2) that has a weight average molecular weight of 10,000 to 1,500,000, and has properties of a Lewis base.

23. The chemical mechanical polishing aqueous dispersion according to claim 22, wherein the water-soluble polymer (D2) has at least one molecular structure selected from the group consisting of a nitrogen-containing heterocyclic ring and a cationic functional group.

24. The chemical mechanical polishing aqueous dispersion according to claim 22, wherein the water-soluble polymer (D2) is a homopolymer comprising a nitrogen-containing monomer as a repeating unit, or a copolymer comprising a nitrogen-containing monomer as a repeating unit.

25. The chemical mechanical polishing aqueous dispersion according to claim 24, wherein the nitrogen-containing monomer is at least one compound selected from the group consisting of N-vinylpyrrolidone, (meth)acrylamide, N-methylolacrylamide, N-2-hydroxyethylacrylamide, acryloylmorpholine, N,N-dimethylaminopropylacrylamide, a diethyl sulfate salt of N,N-dimethylaminopropylacrylamide, N,N-dimethylacrylamide, N-isopropylacrylamide, N-vinylacetamide, N,N-dimethylaminoethylmethacrylic acid, a diethyl sulfate salt of N,N-dimethylaminoethylmethacrylic, and N-vinylformamide.

26. The chemical mechanical polishing aqueous dispersion according to claim 15, wherein the silica particles (A) have a ratio, Rmax/Rmin of a major axis, Rmax to a minor axis, Rmin of 1.0 to 1.5.

27. The chemical mechanical polishing aqueous dispersion according to claim 15, wherein the silica particles (A) have an average particle diameter calculated from a specific surface area determined by a BET method, of 10 to 100 nm.

28. The chemical mechanical polishing aqueous dispersion according to claim 15 having a pH of 6 to 12.

29. A chemical mechanical polishing method comprising polishing a polishing target surface of a semiconductor device that comprises:
  at least one of a metal film;
  a barrier metal film; and
  an insulating film, with the chemical mechanical polishing aqueous dispersion according to claim 1.

* * * * *